US012388397B2

(12) United States Patent
Sato

(10) Patent No.: US 12,388,397 B2
(45) Date of Patent: Aug. 12, 2025

(54) CLOCK GENERATION APPARATUS, CLOCK GENERATION METHOD, ADJUSTMENT APPARATUS, ADJUSTMENT METHOD, AND NON-TRANSITORY COMPUTER READABLE MEDIUM

(71) Applicant: Asahi Kasei Microdevices Corporation, Tokyo (JP)

(72) Inventor: Takayuki Sato, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 67 days.

(21) Appl. No.: 18/471,325

(22) Filed: Sep. 21, 2023

(65) Prior Publication Data
US 2024/0146243 A1 May 2, 2024

(30) Foreign Application Priority Data
Oct. 31, 2022 (JP) .................................. 2022-174144

(51) Int. Cl.
*H03L 1/02* (2006.01)
*H03B 5/04* (2006.01)
(Continued)

(52) U.S. Cl.
CPC ................. *H03B 5/04* (2013.01); *H03B 5/32* (2013.01); *H03B 5/36* (2013.01); *H03K 3/0315* (2013.01);
(Continued)

(58) Field of Classification Search
CPC .... H03B 5/04; H03B 5/32; H03B 5/36; H03L 1/022; H03L 1/026; H03L 1/027;
(Continued)

(56) References Cited

U.S. PATENT DOCUMENTS 4,454,483 A * 6/1984 Baylor .................... H03L 1/026
331/25
5,604,468 A * 2/1997 Gillig .................... H03L 7/1976
331/25
(Continued)

FOREIGN PATENT DOCUMENTS

JP    H0548461 A    2/1993
JP    H0870218 A    3/1996
(Continued)

OTHER PUBLICATIONS

Meisam Heidarpour Roshan et al., "Dual-MEMS-Resonator Temperature-to-Digital Converter with 40uK Resolution and FOM of 0.12pJK2", 2016 IEEE International Solid-State Circuits Conference (ISSCC2016), Feb. 2, 2016.

*Primary Examiner* — Levi Gannon

(57) ABSTRACT

Provided is a clock generation apparatus which generates an output clock signal, comprising: a first voltage-controlled oscillator which outputs the output clock signal; an AD converter which includes: a second voltage-controlled oscillator which outputs an internal clock signal phase-locked to the output clock signal in response to a digital temperature signal having become a value corresponding to an analog temperature signal from a temperature sensor; a phase comparator which detects a phase difference between the output clock signal and the internal clock signal; and a digital temperature signal generator which generates a digital temperature signal according to the phase difference detected by the phase comparator, to output it to the second voltage-controlled oscillator; and a digital temperature compensation circuit which compensates a frequency of the output clock signal of the first voltage-controlled oscillator by using the digital temperature signal.

20 Claims, 37 Drawing Sheets

(51) Int. Cl.
*H03B 5/32* (2006.01)
*H03B 5/36* (2006.01)
*H03K 3/03* (2006.01)
*H03L 7/093* (2006.01)
*H03L 7/22* (2006.01)
*H03L 7/23* (2006.01)

(52) U.S. Cl.
CPC .............. *H03L 1/026* (2013.01); *H03L 1/028* (2013.01); *H03L 7/093* (2013.01); *H03L 7/235* (2013.01)

(58) Field of Classification Search
CPC ....... H03L 1/028; H03L 7/0805; H03L 7/093; H03L 7/0995; H03L 7/22; H03L 7/235; H03K 3/011; H03K 3/0315; H03K 3/0322
See application file for complete search history.

(56) References Cited

U.S. PATENT DOCUMENTS

| | | | | |
|---|---|---|---|---|
| 5,789,986 | A * | 8/1998 | Drost | H03L 7/0995 331/25 |
| 5,892,408 | A * | 4/1999 | Binder | H03L 1/026 331/66 |
| 6,710,663 | B1 * | 3/2004 | Berquist | H03L 1/026 331/3 |
| 10,594,301 | B1 | 3/2020 | Heidary Shalmany | |
| 11,456,751 | B1 * | 9/2022 | Bahr | H03L 7/06 |
| 2002/0118073 | A1 * | 8/2002 | Diewald | G01K 7/32 331/176 |
| 2002/0158700 | A1 | 10/2002 | Nemoto | |
| 2006/0145775 | A1 * | 7/2006 | Zhang | H03L 1/025 331/158 |
| 2008/0297268 | A1 | 12/2008 | Matsui | |
| 2017/0063379 | A1 | 3/2017 | Terasawa | |
| 2017/0310330 | A1 * | 10/2017 | Nakajima | H03L 7/095 |
| 2018/0321065 | A1 | 11/2018 | Vergauwen | |
| 2019/0044523 | A1 * | 2/2019 | Vergauwen | G01D 21/00 |
| 2021/0376839 | A1 * | 12/2021 | Vergauwen | H03M 1/1014 |
| 2024/0223169 | A1 * | 7/2024 | Younkin | H03L 1/02 |

FOREIGN PATENT DOCUMENTS

| | | |
|---|---|---|
| JP | 2004297626 A | 10/2004 |
| JP | 2006025336 A | 1/2006 |
| JP | 2016111522 A | 6/2016 |

* cited by examiner

| TEMPERATURE ZONE # | TEMPERATURE RANGE | TEMPERATURE SHIFT AMOUNT $T_S$ [°C] | COMPENSATION GAIN OF EACH ORDER |
|---|---|---|---|
| 1 | −40~−11°C | 0 | $G_{11}$(FIRST ORDER), $G_{12}$(SECOND ORDER), $G_{13}$(THIRD ORDER), ......, $G_{1N}$(N-TH ORDER) |
| 2 | −11~+18°C | 29 | $G_{21}$(FIRST ORDER), $G_{22}$(SECOND ORDER), $G_{23}$(THIRD ORDER), ......, $G_{2N}$(N-TH ORDER) |
| 3 | +18~+47°C | 58 | $G_{31}$(FIRST ORDER), $G_{32}$(SECOND ORDER), $G_{33}$(THIRD ORDER), ......, $G_{3N}$(N-TH ORDER) |
| 4 | +47~+76°C | 87 | $G_{41}$(FIRST ORDER), $G_{42}$(SECOND ORDER), $G_{43}$(THIRD ORDER), ......, $G_{4N}$(N-TH ORDER) |
| 5 | +76~+105°C | 116 | $G_{51}$(FIRST ORDER), $G_{52}$(SECOND ORDER), $G_{53}$(THIRD ORDER), ......, $G_{5N}$(N-TH ORDER) |

CLOCK GENERATION APPARATUS, CLOCK GENERATION METHOD, ADJUSTMENT APPARATUS, ADJUSTMENT METHOD, AND NON-TRANSITORY COMPUTER READABLE MEDIUM

The contents of the following patent application(s) are incorporated herein by reference: NO. 2022-174144 filed in JP on Oct. 31, 2022

BACKGROUND

1. Technical Field

The present invention relates to a clock generation apparatus, a clock generation method, an adjustment apparatus, an adjustment method, and a non-transitory computer readable medium.

2. Related Art

Patent Document 1 describes a clock generator including: a resonator; a temperature sensor 151; a dual-path compensation signal generator 153; and a frequency compensator 155 (column 4, lines 26 to 40, FIG. 2). Column 9, line 17 to column 10, line 35 and FIGS. 6A to 6D describe the one using a phase-locked loop (PLL) as a frequency compensation circuit. Non-Patent Document 1 describes a temperature to digital converter (TEMPDC) which uses two MEMS resonators.

PRIOR ART DOCUMENT

Patent Document

Patent Document 1: Specification of U.S. Pat. No. 10,594,301

Non-Patent Document

Non-Patent Document 1: Meisam Heidarpour Roshan, and other 13 persons, "Dual-MEMS-Resonator Temperature-to-Digital Converter with 40 µK Resolution and FOM of 0.12 pJK2", 2016 IEEE International Solid-State Circuits Conference (ISSCC2016), Feb. 2, 2016

BRIEF DESCRIPTION OF THE DRAWINGS

FIG. 15 shows a setting for each temperature zone in the polynomial circuit 1442.

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solution of the invention.

Figure 1:
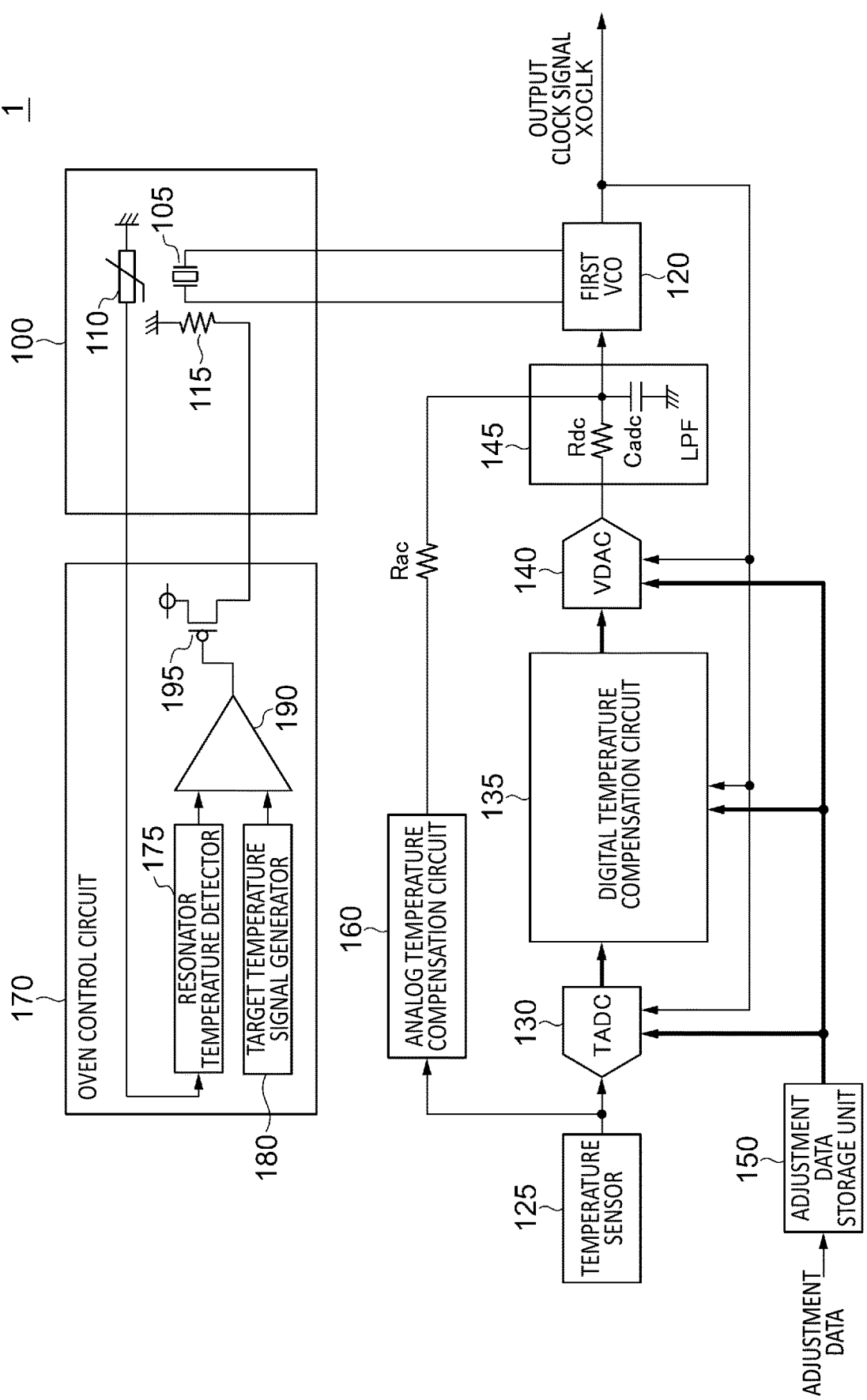
FIG. 1 shows a configuration of a clock generation apparatus 1 according to the present embodiment.

FIG. 1 shows a configuration of a clock generation apparatus 1 according to the present embodiment. The clock generation apparatus 1 generates and output an output clock signal XOCLK. The clock generation apparatus 1 outputs a clock signal generated by a first voltage-controlled oscillator (first VCO) 120 as an output clock signal, and sets an operation frequency of another circuit in the clock generation apparatus 1 to an integer multiple (integer multiple by an integer of one or two or more) of that of the output clock signal, thereby suppressing noise interference to the output clock signal.

The clock generation apparatus 1 includes a resonator 105, the first voltage-controlled oscillator (first VCO) 120, a temperature sensor 125, a temperature analog-to-digital converter (TADC) 130, a digital temperature compensation circuit 135, a voltage digital-to-analog converter (VDAC) 140, and a low pass filter (LPF) 145. The first VCO 120 is also referred to as a voltage-controlled crystal oscillator (VCXO) if it oscillates with a crystal resonator. The resonator 105 is a resonator (vibrator) such as the crystal resonator, a MEMS resonator, or a langasite type resonator.

The first VCO 120 generates the output clock signal by using the resonator 105, to output it to an apparatus, a circuit, or the like external to the clock generation apparatus 1. The first VCO 120 changes a frequency of the output clock signal depending on a control voltage inputted from the LPF 145. The clock generation apparatus 1 maintains the frequency of the output clock signal outputted by the first VCO 120 at a target frequency independent of temperature, by adjusting the control voltage according to temperature.

The temperature sensor 125 measures temperature of the clock generation apparatus 1, to output an analog temperature signal according to the temperature of the clock generation apparatus 1. The temperature sensor 125 may be provided in a housing of the clock generation apparatus 1, to measure temperature in the housing. In addition, the clock generation apparatus 1 may be provided near the resonator 105, to measure temperature of the resonator 105.

The TADC 130 is connected to the first VCO 120 and the temperature sensor 125. The TADC 130 is an example of an AD converter, and is also referred to as a temperature to digital converter (TEMPDC). The TADC 130 converts the analog temperature signal from the temperature sensor 125 to a digital temperature signal.

The digital temperature compensation circuit 135 is connected to the first VCO 120 and the TADC 130. The digital temperature compensation circuit 135 compensates the frequency of the output clock signal of the first VCO 120 by using the digital temperature signal from the TADC 130. In the present embodiment, the digital temperature compensation circuit 135 generates a digital temperature compensation signal for compensating the frequency of the output clock signal, by digitally processing the digital temperature signal.

The VDAC 140 is connected to the digital temperature compensation circuit 135. The VDAC 140 converts the digital temperature compensation signal from the digital temperature compensation circuit 135, to output it as an analog temperature compensation signal.

The LPF 145 is connected to the VDAC 140. The LPF 145 outputs, to the first VCO 120, the control voltage obtained by low-pass filtering the analog temperature compensation signal from the VDAC 140. The first VCO 120 inputs the control voltage according to the analog temperature compensation signal, to adjust the frequency of the output clock signal.

The clock generation apparatus 1 may further include any combination of an adjustment data storage unit 150, an analog temperature compensation circuit 160, or an oven control circuit 170. The adjustment data storage unit 150 stores adjustment data for adjusting at least one of the TADC 130, the digital temperature compensation circuit 135, or the VDAC 140. In response to a power supply being turned on, the clock generation apparatus 1 reads out, from the adjustment data storage unit 150, respective adjustment parameters of the TADC 130, the digital temperature compensation circuit 135, and the VDAC 140, to be set in the TADC 130, the digital temperature compensation circuit 135, and the VDAC 140.

The analog temperature compensation circuit 160 is connected to the temperature sensor 125. The analog temperature compensation circuit 160 compensates the frequency of the output clock signal of the first VCO 120 according to the analog temperature signal from the temperature sensor 125. In the example of the present figure, the first VCO 120 receives the control voltage in which the analog temperature compensation signal obtained by converting the digital temperature compensation signal from the digital temperature compensation circuit 135 to analog by the VDAC 140 and a second analog temperature compensation signal generated by the analog temperature compensation circuit 160 are divided by a resistor Rdc and a resistor Rac and low-pass filtered.

The analog temperature compensation circuit 160 suppresses a frequency error of the output clock signal to, for example, approximately ½ or less. As a result, the digital temperature compensation circuit 135 can compensate the frequency error of the output clock signal, which remains even after temperature compensation by the analog temperature compensation circuit 160. As a result, if the clock generation apparatus 1 includes the analog temperature compensation circuit 160, the digital temperature compensation circuit 135 can reduce a range of a digital compensation component to improve resolution of the digital compensation component. In addition, the clock generation apparatus 1 can reduce a gain of noise from the digital temperature compensation circuit 135 to be transmitted to 120, and can reduce the noise of the output clock signal.

In addition, the digital temperature compensation circuit 135 has a high degree of freedom in the temperature compensation through digital processing, and can generate the compensation component which fits even the frequency error steep with respect to a temperature change. On the other hand, in the digital temperature compensation circuit 135, quantization noise may be mixed into the output clock signal due to the digital processing. In contrast, the analog temperature compensation circuit 160 may hardly generate the compensation component which fits the frequency error steep with respect to the temperature change, but is free of quantization noise. When including both the digital temperature compensation circuit 135 and the analog temperature compensation circuit 160, the clock generation apparatus 1 can generate the output clock signal with a small frequency error and little noise by compensating most of the frequency error with the analog temperature compensation circuit 160 and compensating the rest of the frequency error including the frequency error steep with respect to the temperature change with the digital temperature compensation circuit 135.

If the clock generation apparatus 1 includes the oven control circuit 170, the resonator 105 is arranged in an oven 100 together with a temperature sensor 110 and a heater 115. Here, the resonator 105 may be provided outside a semiconductor chip containing the TADC 130, the digital temperature compensation circuit 135, and the like. Such a semiconductor chip may further contain at least one of the first VCO 120, the VDAC 140, the LPF 145, the adjustment data storage unit 150, or the analog temperature compensation circuit 160, or some of these components.

The oven 100 seals a space in which the resonator 105, the temperature sensor 110, and the heater 115 are arranged, so that temperature of this space can be maintained at constant temperature. The temperature sensor 110 is arranged near the resonator 105, and measures the temperature of the resonator 105. The temperature sensor 110 may be provided separately from the temperature sensor 125, or may be used as the temperature sensor 125. The heater 115 is arranged near the resonator 105, and heats the resonator 105.

The oven control circuit 170 is connected to the oven 100. The oven control circuit 170 controls the temperature of the resonator 105 in the oven 100 to be kept constant. The oven control circuit 170 has a resonator temperature detector 175, a target temperature signal generator 180, a differential amplifier 190, and a heater driving circuit 195.

The resonator temperature detector 175 is connected to the temperature sensor 110. The resonator temperature detector 175 detects the analog temperature signal from the temperature sensor 110. The resonator temperature detector 175 may output a voltage according to the analog temperature signal. The target temperature signal generator 180 generates a target temperature signal indicating target temperature of the resonator 105. The target temperature of the resonator 105 may be temperature higher than normal temperature, such as, for example, 110 degrees C. The target temperature signal generator 180 may output a voltage according to the target temperature as the target temperature signal.

The differential amplifier 190 is connected to the resonator temperature detector 175 and the target temperature signal generator 180. The differential amplifier 190 amplifies and outputs a difference (for example, voltage difference) between the analog temperature signal from the resonator temperature detector 175 and the target temperature signal from the target temperature signal generator 180. The heater driving circuit 195 is connected to the differential amplifier 190. The heater driving circuit 195 allows a current according to the difference between the analog temperature signal and the target temperature signal to flow through the heater 115. The heater driving circuit 195, which may be a MOSFET, may be turned off and not allow the current to flow through the heater 115 if the temperature indicated by the analog temperature signal is higher than the temperature indicated by the target temperature signal, and may be turned on and allow the current to flow through the heater 115 if the temperature indicated by the analog temperature signal is lower than the temperature indicated by the target temperature signal. In addition, if priority is given to current consumption and area reduction, the clock generation apparatus 1 may not include the oven control circuit 170, the heater 115, and the temperature sensor 110.

Figure 2:
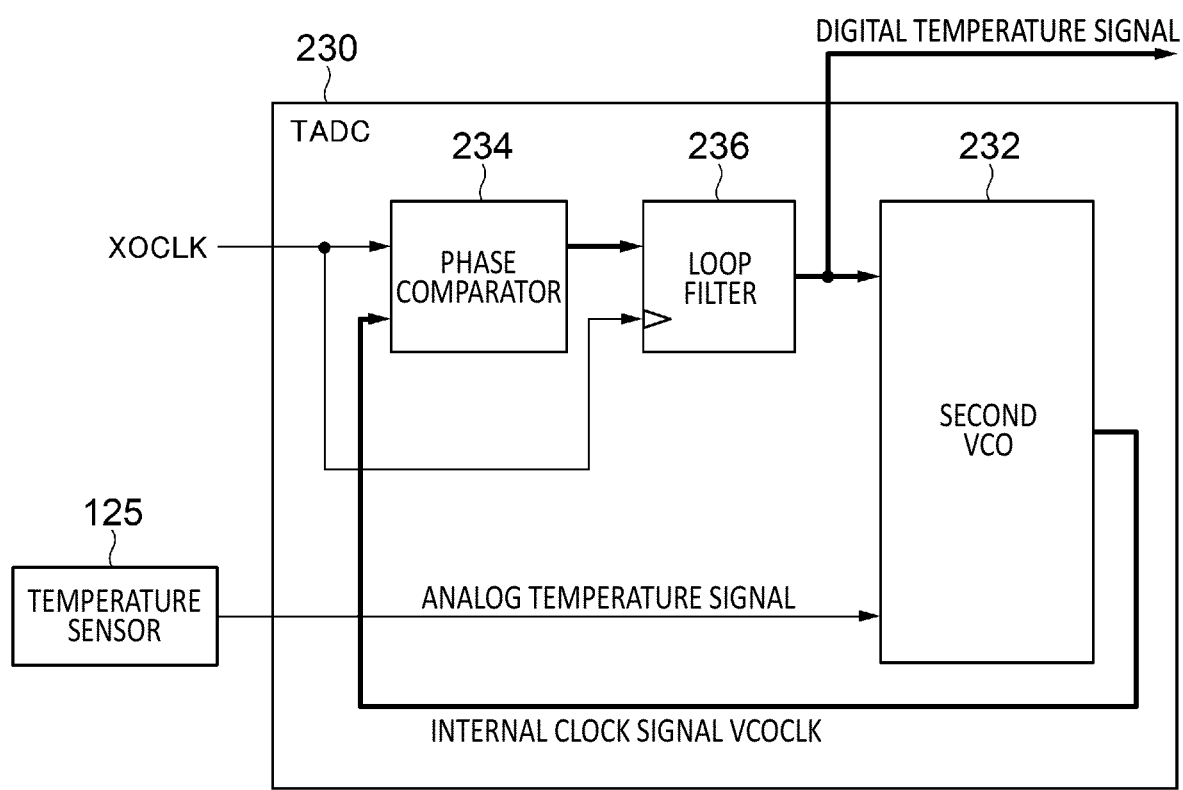
FIG. 2 shows a configuration of a TADC 230 according to the present embodiment.

FIG. 2 shows a configuration of a TADC 230 according to the present embodiment. The clock generation apparatus 1 may use the TADC 230 shown in the present figure as the TADC 130, or may use another TADC. The TADC 230 has a second voltage-controlled oscillator (second VCO) 232, a phase comparator 234, and a loop filter 236.

The second VCO 232 outputs an internal clock signal (VCOCLK). The second VCO 232 may generate the internal clock signal by using a phase-locked loop (PLL) being as the entire TADC 230. The second VCO 232 outputs such an internal clock signal as will be phase-locked to an output clock signal in response to a digital temperature signal having become a value corresponding to an analog temperature signal from the temperature sensor 125.

The phase comparator 234 is connected to the second VCO 232. The phase comparator 234 detects a phase difference between the output clock signal (XOCLK) from the first VCO 120 and the internal clock signal, to output a phase difference signal according to the phase difference.

The loop filter 236 is connected to the phase comparator 234. The loop filter 236 functions as a digital temperature signal generator, and filters the phase difference signal, thereby generating the digital temperature signal according to the phase difference detected by the phase comparator 234. Here, filtering processing may include time integral processing of an input signal. Accordingly, the loop filter 236 may perform filtering which involves a time integral on the phase difference signal, and in this case, the loop filter 236 may generate the digital temperature signal according to the time integral of the phase difference detected by the phase comparator 234. In addition, the loop filter 236 filters the phase difference signal, thereby generating a feedback signal according to the phase difference detected by the phase comparator 234, to supply it to the second VCO 232. Since a signal obtained by applying conversion such as filtering to the phase difference signal in this manner is an example of a signal based on the phase difference signal, and is according to the phase difference, it can be regarded as a kind of the phase difference signal. In the example of the present figure, the loop filter 236 supplies the digital temperature signal to the second VCO 232 as the feedback signal. As a result, the second VCO 232 outputs the internal clock signal with a frequency according to the analog temperature signal and the phase difference detected by the phase comparator.

In the TADC 230 described above, a phase of the internal clock signal outputted by the second VCO 232 will be locked to a phase of the output clock signal under feedback control from the digital temperature signal via the PLL. If an analog temperature signal input to the second VCO 232 changes in this state, the PLL changes the digital temperature signal instead to maintain a phase lock state of the internal clock signal. That is, the TADC 230 converts an amount of change in the analog temperature signal to an amount of change in the digital temperature signal (both are the same amount of change in terms of temperature). In this manner, the TADC 230 functions as an analog-to-digital converter which outputs the digital temperature signal corresponding to the analog temperature signal.

Note that, in the example of the present figure, a frequency of the internal clock signal is adjusted to a frequency of the output clock signal. If the frequency of the internal clock signal is adjusted to a frequency equivalent to an integer multiple of the frequency of the output clock signal by an integer equal to or greater than two, the TADC 230 may include a frequency divider which divides a frequency by an integer divide ratio and is placed between the second VCO 232 and the phase comparator 234, and may divide the internal clock signal with the frequency divider. Alternatively, the TADC 230 may not have the frequency divider as described above even if the internal clock signal has the frequency equivalent to the integer multiple of the frequency of the output clock signal by an integer equal to or greater than two, and may perform phase comparison of edges of the output clock signal and the internal clock signal for each cycle of the output clock signal with the phase comparator 234. Specifically, if the frequency of the internal clock signal is N times (N is an integer equal to or greater than 1) the frequency of the output clock signal, no matter whether N is 1, 2, 3, . . . , a frequency at which an output value of the phase comparator 234 is updated is the same as the frequency of the output clock signal. Accordingly, regardless of a value of N, the output value of the phase comparator 234 does not change, and it is possible to realize a state in which the phase of the internal clock signal is locked to the phase of the output clock signal. Therefore, the TADC 230 does not need to include a frequency divider which divides a frequency by a divide ratio of N and is placed between the second VCO 232 and the phase comparator 234, if it includes a second VCO which is restricted to output the internal clock signal at a frequency within a range greater than (N−1) times and less than (N+1) times the frequency of the output clock signal, or if it separately includes a circuit for controlling the frequency of the internal clock signal to be close to N times the frequency of the output clock signal.

Figure 3:
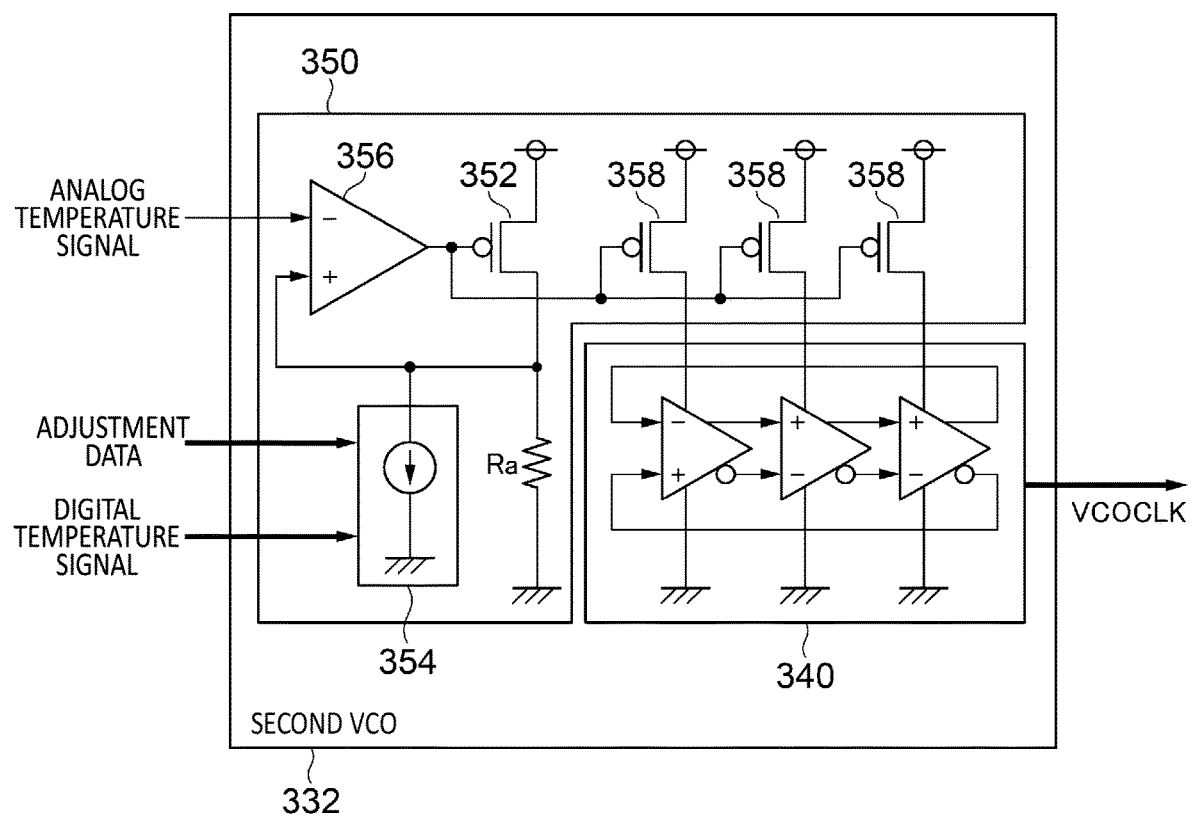
FIG. 3 shows a configuration of a second VCO 332 according to the present embodiment.

FIG. 3 shows a configuration of a second VCO 332 according to the present embodiment. The clock generation apparatus 1 may use the second VCO 332 as a circuit in the TADC 130 or as the second VCO 232 in the TADC 230. The second VCO 332 includes a ring oscillator 340 and a power supply current generator 350.

The ring oscillator 340 oscillates at a frequency according to a difference between temperature designated by an analog temperature signal from the temperature sensor 125 and temperature designated by a digital temperature signal. In the present embodiment, the ring oscillator 340 oscillates at a frequency according to a power supply current received from the power supply current generator 350, to generate an internal clock signal (VCOCLK). In the example of the present figure, the ring oscillator 340 has a plurality of inverting delay elements (an odd number of inverting delay elements) connected in a ring form, and is inverted each time the internal clock signal passes through the plurality of inverting delay elements. Note that the ring oscillator 340 may include any number of non-inverting delay elements between the inverting delay elements. The ring oscillator 340 further increases a frequency of the internal clock signal because switching speed of each inverting delay element is higher as the power supply current inputted from the power supply current generator 350 is higher. The ring oscillator 340 further decreases the frequency of the internal clock signal, because the switching speed of each inverting delay element is lower as the power supply current inputted from the power supply current generator 350 is lower.

In the present embodiment, the ring oscillator 340 outputs, as the internal clock signal, a polyphase internal clock signal having a plurality of phases with different phases. The ring oscillator 340 may output, as a clock signal VCK [k] (k=K−1, . . . 2, 1, 0) for each phase of a polyphase clock signal, K clock signals outputted by every predetermined number (even number) of inverting delay elements among the plurality of inverting delay elements. As a result, the ring oscillator 340 can output the polyphase internal clock signal VCK [K−1:0] whose phase is shifted by the time required for a signal to pass through a predetermined number of inverting logical elements. Note that the VCK [K−1:0] indicates a set of K signals of VCK [K−1], . . . VCK [2], VCK [1], VCK [0].

The power supply current generator 350 supplies the ring oscillator 340 with the power supply current according to the analog temperature signal from the temperature sensor 125 and a phase difference detected by the phase comparator 234. In the example of the present figure, the power supply current generator 350 inputs the digital temperature signal as a feedback signal according to a phase difference signal outputted by the phase comparator 234, and supplies the ring oscillator 340 with the power supply current according to the difference between temperature designated by the analog temperature signal and temperature designated by the digital temperature signal.

The power supply current generator 350 includes an FET 352, a resistor Ra, a current DAC 354, a differential amplifier 356, and an FET 358. The FET 352 and the resistor Ra are connected in series between a power supply and ground. The FET 352 may be a MOSFET, and adjusts a current flowing between main terminals (between a drain and a source) according to a voltage inputted to a control terminal (gate). The resistor Ra sets a node between the FET 352 and the resistor Ra to a voltage according to a current flowing through the resistor Ra (voltage=resistance value Ra×current).

The current DAC 354 draws, from the FET 352, and passes a current designated by a digital feedback signal (digital temperature signal). As a result, the resistor Ra allows a current to flow which is obtained by subtracting a current flowing through the current DAC 354 from a current flowing through the FET 352. The differential amplifier 356 controls a voltage of the control terminal of the FET 352 according to a result of comparing a voltage of the node between the FET 352 and the resistor Ra with a voltage of the analog temperature signal. As a result, the differential amplifier 356 adjusts the current flowing through the FET 352 such that the voltage of the node between the FET 352 and the resistor Ra matches the voltage of the analog temperature signal.

In the present embodiment, the analog temperature signal inputted to the second VCO 332 has a lower voltage as temperature increases and a higher voltage as the temperature decreases. For the same value of the digital temperature signal, the power supply current generator 350 allows a more current to flow through the FET 352, to increase the voltage of the node between the FET 352 and the resistor Ra, as a value of the analog temperature signal increases (that is, as the temperature designated by the analog temperature signal decreases). In addition, for the same value of the analog temperature signal, the power supply current generator 350 increases an amount of current drawn by the current DAC 354, to increase the current flowing through the FET 352, as a value of the digital temperature signal increases (that is, as the temperature designated by the digital temperature signal increases). As a result, the power supply current generator 350 allows a current according to the difference between the temperature designated by the analog temperature signal and the temperature designated by the digital temperature signal, more specifically, a current according to a difference obtained by subtracting the temperature designated by the analog temperature signal from the temperature designated by the digital temperature signal to flow through the FET 352.

The plurality of FETs 358 are respectively provided corresponding to a plurality of inverting logical elements in the ring oscillator 340, and respectively allow the power supply current proportional to the current flowing through the FET 352 to flow through the plurality of inverting logical elements. As a result, if the temperature designated by the digital temperature signal is higher than the temperature designated by the analog temperature signal, the power supply current generator 350 transiently increases the frequency of the internal clock signal above a reference frequency. However, this frequency increase is canceled out by a frequency decrease involved with a decrease in the digital temperature signal due to a feedback of the PLL, and finally, the state converges such that the temperature designated by the digital temperature signal matches the temperature designated by the analog temperature signal. Conversely, if the temperature designated by the digital temperature signal is lower than the temperature designated by the analog temperature signal, the power supply current generator 350 transiently decreases the frequency of the internal clock signal below the reference frequency. However, that frequency decrease is canceled out by a frequency increase involved with an increase in the digital temperature signal due to the feedback of the PLL, and finally, the state converges such that the temperature designated by the digital temperature signal matches the temperature designated by the analog temperature signal.

Figure 4A:
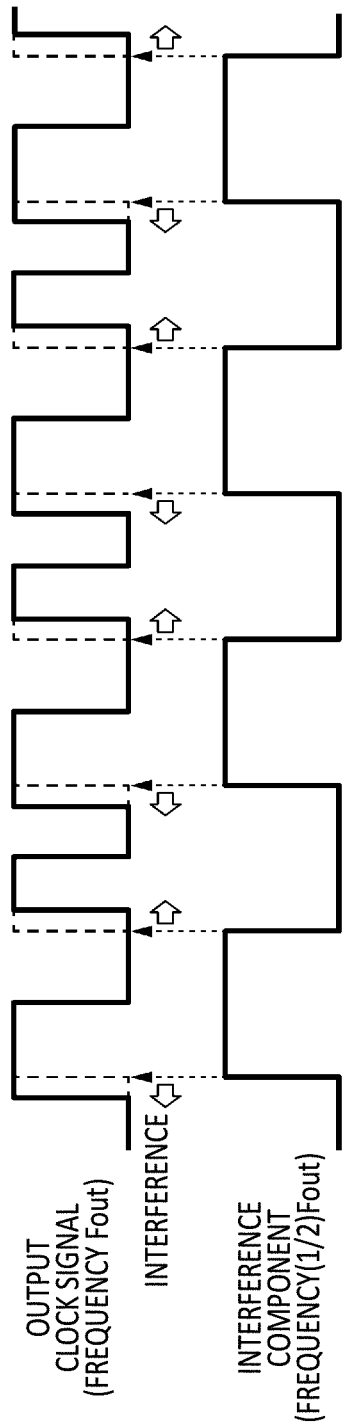
FIG. 4A shows time waveforms for a case where an output clock signal is affected by an interference component with a half frequency.

FIG. 4A shows time waveforms for a case where an output clock signal is affected by an interference component with a half frequency.

Figure 4B:
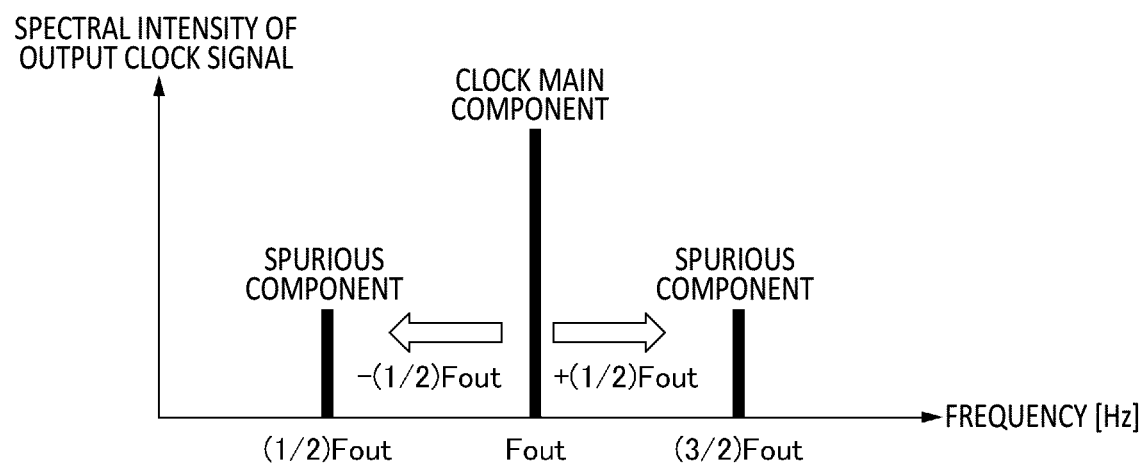
FIG. 4B shows a frequency spectrum for a case where an output clock signal is affected by an interference component with a half frequency.

FIG. 4B shows a frequency spectrum for a case where an output clock signal is affected by an interference component with a half frequency. If a circuit in the clock generation apparatus 1 operates at a frequency (½) Fout equivalent to ½ of a frequency Fout of the output clock signal, as shown in FIG. 4A, an edge for each period of the output clock signal (rising edge in FIG. 4A) is alternately affected by a rising edge and a falling edge of the interference component with the frequency (½) Fout, which increases or decreases a length of a clock period. As a result, as shown in FIG. 4B, the output clock signal is equivalent to that modulated at a modulation frequency (½) Fout, and spurious components with the frequency (½) Fout and a frequency (3/2) Fout are superimposed on a main component with the frequency Fout. Similarly, noise is superimposed on the output clock signal by the influence of the interference component having a frequency less than the frequency Fout.

Figure 5A:
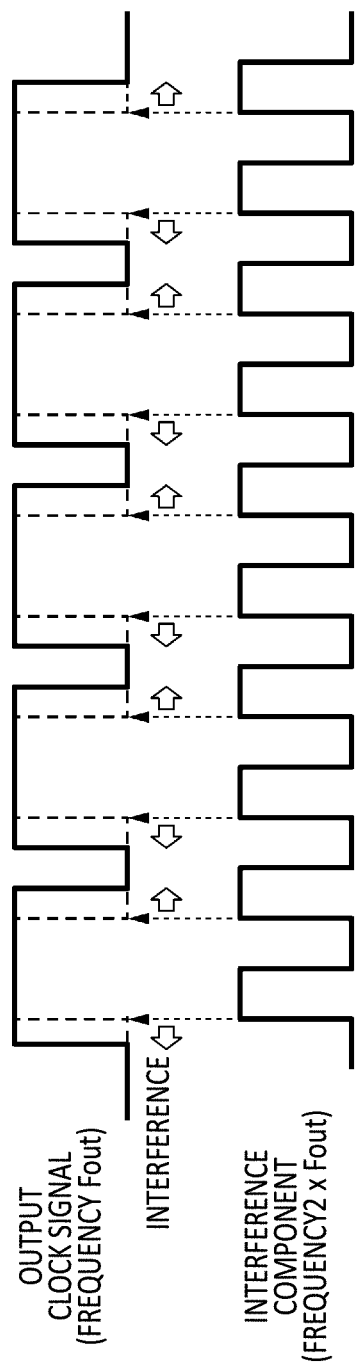
FIG. 5A shows time waveforms for a case where an output clock signal is affected by an interference component with a doubled frequency.

FIG. 5A shows time waveforms for a case where an output clock signal is affected by an interference component with a doubled frequency.

Figure 5B:
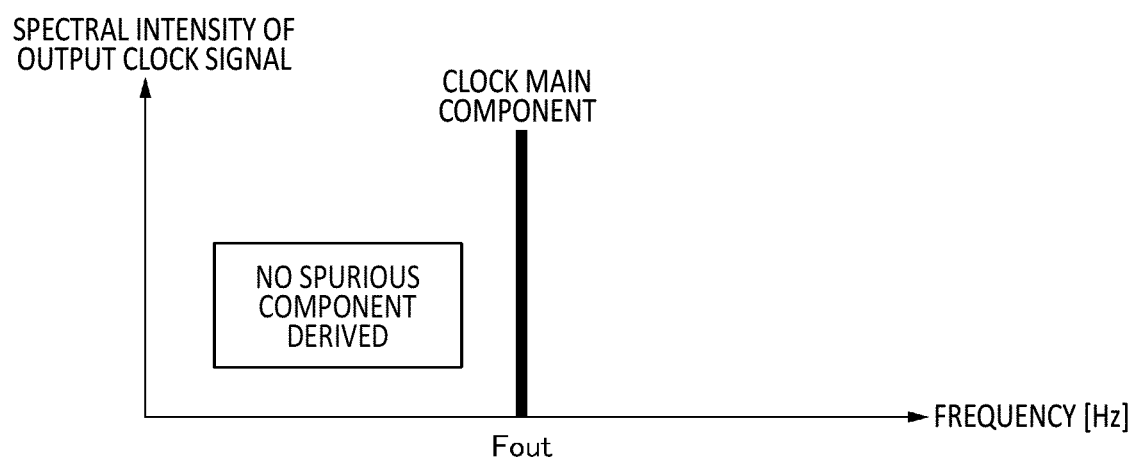
FIG. 5B shows a frequency spectrum for a case where an output clock signal is affected by an interference component with a doubled frequency.

FIG. 5B shows a frequency spectrum for a case where an output clock signal is affected by an interference component with a doubled frequency. If a circuit in the clock generation apparatus 1 operates at a frequency 2×Fout equivalent to twice the frequency Fout of the output clock signal, as shown in FIG. 5A, although an edge for each period of the output clock signal (rising edge and falling edge in FIG. 5A) is affected by a rising edge of the interference component with the frequency 2×Fout, a clock period does not vary unless a frequency of the interference component varies. As a result, as shown in FIG. 5B, no spurious component is superimposed on the output clock signal even if there is the interference component with the frequency 2×Fout. Similarly, no noise is superimposed on the output clock signal by the influence of the interference component having a frequency equivalent to an integer multiple (integer multiple by a positive integer) of the frequency Fout.

Therefore, the second VCO 232 according to the present embodiment is adjusted to have a frequency equivalent to an integer multiple of a frequency of the output clock signal, and is configured to generate an internal clock signal phase-locked to the output clock signal in response to a digital temperature signal having become a value corresponding to an analog temperature signal from a temperature sensor. As a result, the clock generation apparatus 1 can prevent the internal clock signal from superimposing the spurious component on the output clock signal, to reduce noise superimposed on the output clock signal.

In addition, the clock generation apparatus 1 according to the present embodiment outputs a clock signal from the first VCO 120 to an outside as the output clock signal of the clock generation apparatus 1, and uses a clock signal from the second VCO 232 only in the clock generation apparatus 1. Here, while a Q value (quality factor) of a MEMS resonator is, for example, about tens of thousands, a Q value of a VCO with a PLL containing an IC is, for example, about 10 even in a case of an LC tank type oscillator configuration which is considered to have good noise performance, and the VCO containing the IC has much worse noise performance than the VCO using the MEMS resonator or the like. Therefore, when using an oscillator which oscillates using the resonator 105 such as a crystal resonator or the MEMS resonator as the first VCO 120 and when using an oscillator which oscillates using the PLL as the second VCO 232, the clock generation apparatus 1 can output, as the output clock signal, the clock signal from the first VCO 120 with low noise.

Figure 6:
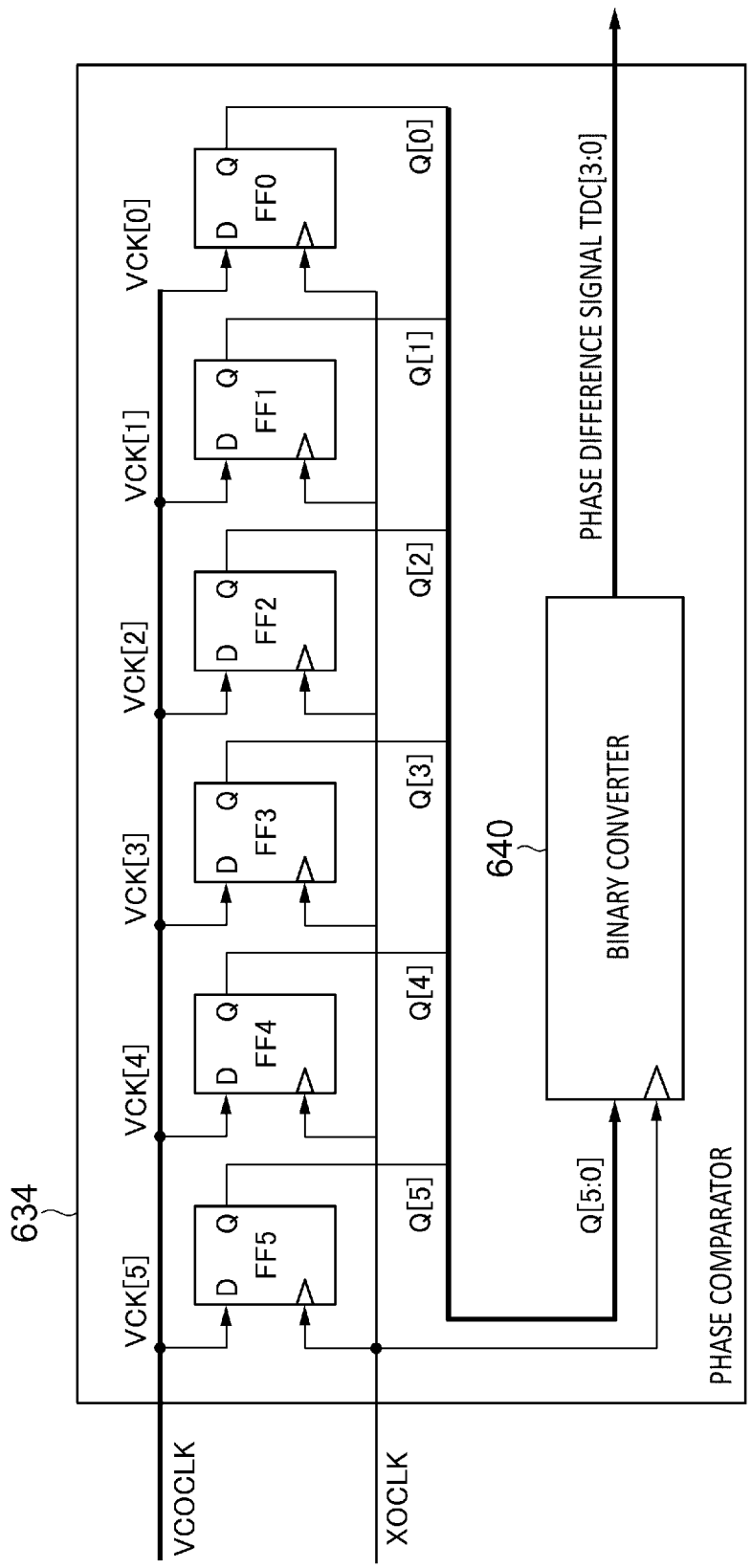
FIG. 6 shows a configuration of a phase comparator 634 according to the present embodiment.

FIG. 6 shows a configuration of a phase comparator 634 according to the present embodiment. The clock generation apparatus 1 may use the phase comparator 634 as a circuit in the TADC 130 or as the phase comparator 234 in the TADC 230. The phase comparator 634 includes a plurality of flip-flops (FF) and a binary converter 640.

The plurality of FFs (FF5 to FF0 in the figure) respectively sample the polyphase internal clock signal VCK [5:0] at the timing of an output clock signal (for example, at a rising edge). Then, the plurality of FFs output a value Q [5:0] obtained by sampling the polyphase internal clock signal VCK [5:0]. In the present embodiment, the phase comparator 634 includes six FFs, but the number of FFs may be any number equal to or greater than two. The binary converter 640 is connected to the plurality of FFs, and converts the value Q [5:0] to a phase difference signal TDC [3:0].

Figure 7:
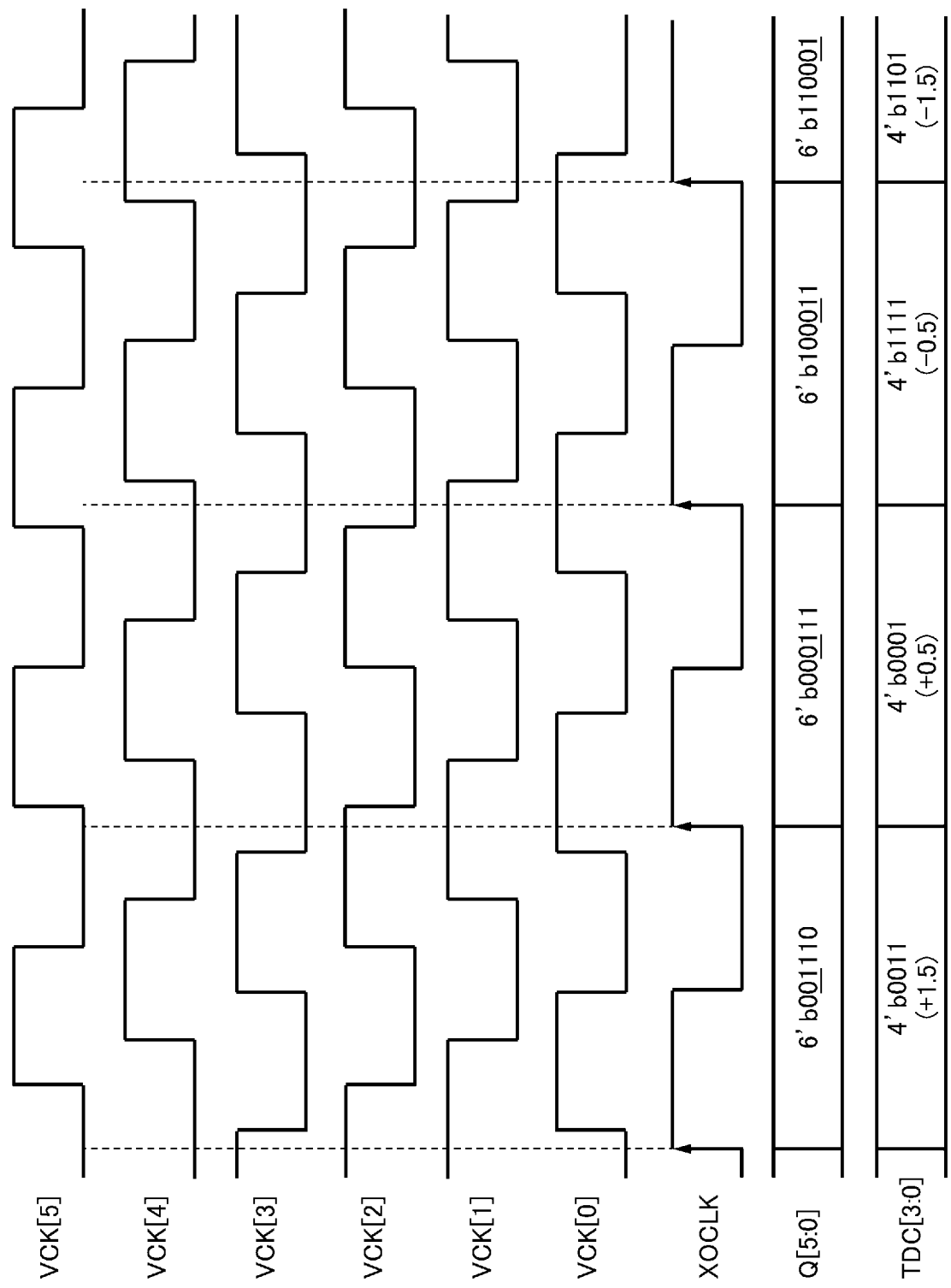
FIG. 7 shows an example of operation waveforms of the phase comparator 634.

FIG. 7 shows an example of operation waveforms of the phase comparator 634. The phase comparator 634 inputs the polyphase internal clock signal VCK [5:0] each of which is adjusted to have the same frequency as that of an output clock signal and whose phase is shifted by a predetermined phase difference. The plurality of FFs sample the polyphase internal clock signal VCK [5:0] at the timing of the output clock signal (XOCLK). In the example of the present figure, the plurality of FFs sample Q [5:0]=6'b001110 at the first rising edge of the output clock signal, Q [5:0]=6'b000111 at the second rising edge, Q [5:0]=6'b100011 at the third rising edge, and Q [5:0]=6'b110001 at the fourth rising edge. Note that 6'bXXXXXX indicates a value of "XXXXXX" in 6-bit binary number.

The binary converter 640 converts the value Q [5:0] to the phase difference signal TDC [3:0] indicating a phase difference. In the example of the present figure, the binary converter 640 decides a value of the output TDC [3:0] according to a position of a digit whose value has changed from 0 to 1 when the value of each digit of the Q [5:0] is viewed from a higher-order bit. Note that the binary converter 640 identifies the digit whose value has changed from 0 to 1, considering bits of the Q [5:0] to be cyclic and considering a Q [0] to be a higher-order digit of the Q [5]. With the TDC [3:0] as 4'b0011 when Q [5:0]=6'b001110, it is indicated that the phase of the output clock signal XOCLK is +1.5 steps ahead of the phase of the internal clock signal VCOCLK (that is, the phase of the internal clock signal VCOCLK should be advanced by +1.5 steps). With the TDC [3:0] as 4'b0001 when Q [5:0]=6'b000111, the binary converter 640 indicates that the phase of the output clock signal XOCLK is +0.5 steps ahead of the phase of the internal clock signal VCOCLK. With the TDC [3:0] as 4'b1111 when Q [5:0]=6'b100011, the binary converter 640 indicates that the phase of the output clock signal XOCLK is −0.5 steps ahead of (0.5 steps behind) the phase of the internal clock signal VCOCLK. With the TDC [3:0] as 4'b1101 when Q [5:0]=6'b110001, the binary converter 640 indicates that the phase of the output clock signal XOCLK is −1.5 steps ahead of (1.5 steps behind) the phase of the internal clock signal VCOCLK. Note that, for the phase difference signal TDC [3:0] described above, one unit is 0.5 steps and a negative value is represented in complement representation of two.

The phase comparator 634 performs digital phase comparison of the output clock signal and the internal clock signal as mentioned above, to output a digital phase difference signal TDC [5:0]. The second VCO 232 or the second VCO 332 receives a feedback signal (digital temperature signal) according to the phase difference signal TDC [5:0] via the loop filter 236, receives a substantially high feedback signal to generally increase a frequency of the internal clock signal if the phase difference signal TDC [5:0] is positive, and receives a substantially low feedback signal to generally decrease the frequency of the internal clock signal if the phase difference signal TDC [5:0] is negative. As a result, the TADC 230 can adjust the frequency of the internal clock signal to have a frequency equivalent to an integer multiple of a frequency of the output clock signal, to phase-lock the internal clock signal to the output clock signal.

As described above, the TADC 130 may be realized by the TADC 230, and in this case, the TADC 230 converts an analog temperature signal from the temperature sensor 125 to the digital temperature signal by using the internal clock signal having the frequency equivalent to the integer multiple of the frequency of the output clock signal. Here, assuming that an AD converter which directly converts a voltage of the analog temperature signal to a digital value is used as the TADC 130, in order to reduce noise of the output clock signal, an AD converter with a resolution high enough to express the digital temperature signal must be operated at the frequency equivalent to the integer multiple of the frequency of the output clock signal. However, such a high-resolution AD converter is hardly operated at high speed, and hardly prevents spurious generation. For example, in case of a delta-sigma modulator type AD converter, the overall operation speed is controlled by operation speed of an analog integrator or a switched capacitor circuit sampling an analog voltage, which makes it difficult to operate the converter at the frequency equivalent to the integer multiple of the frequency of the output clock signal. In addition, for example, in case of a successive approximation register type (SAR type) AD converter, conversion operation will be performed M times in order to obtain an M-bit digital value through the successive approximation process. When this conversion operation is performed M times in synchronization with the output clock signal with the frequency Fout, a frequency component with frequency (1/M) Fout is generated in the AD converter, and a spurious component is superimposed on the output clock signal. The TADC 230 can be realized without using such a high-speed and high-resolution AD converter by converting the analog temperature signal to the digital temperature signal with a PLL.

Figure 8:
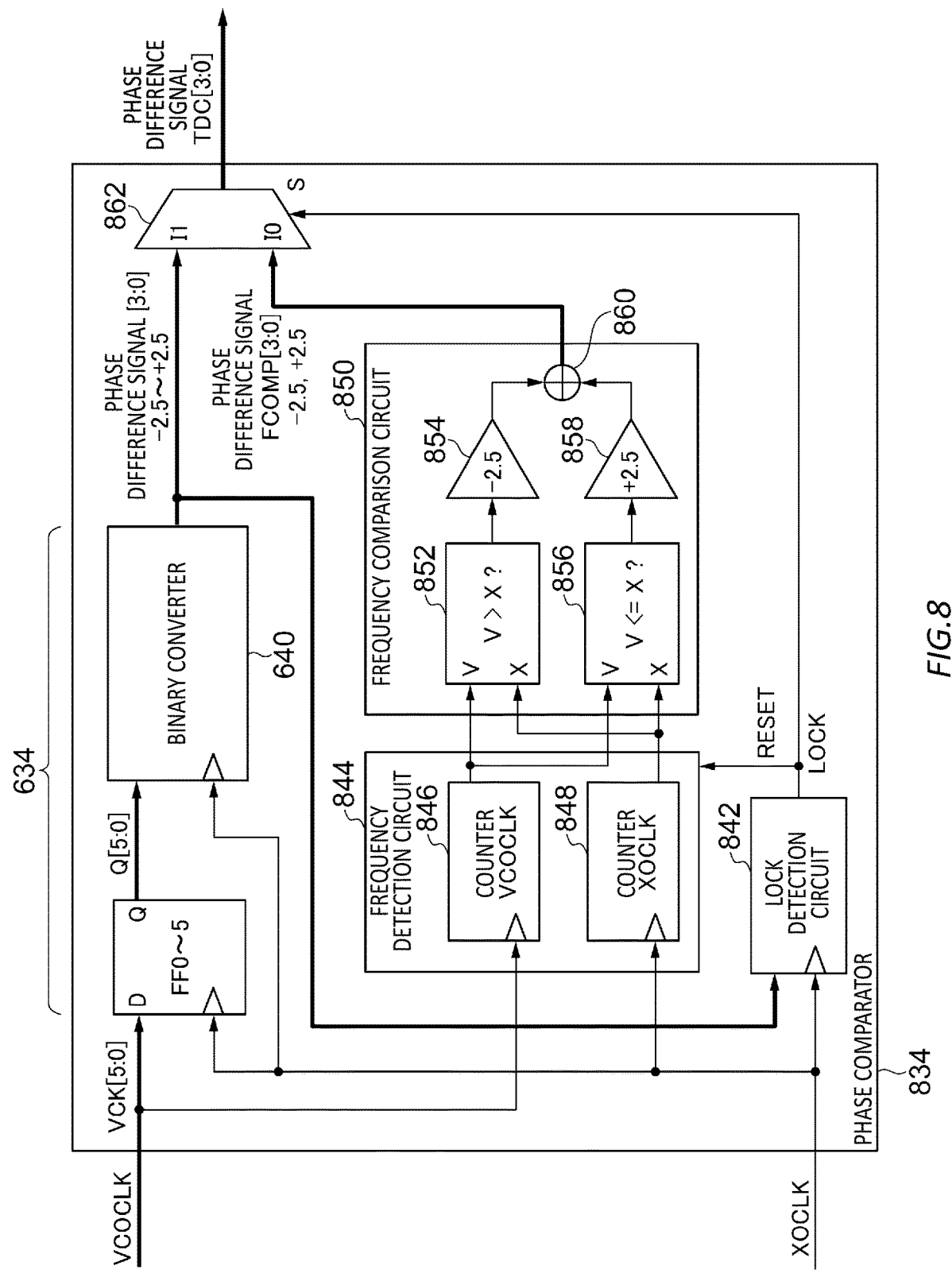
FIG. 8 shows a configuration of a phase comparator 834 according to a modified example.

FIG. 8 shows a configuration of a phase comparator 834 according to a modified example. The clock generation apparatus 1 may use the phase comparator 834 as a circuit in the TADC 130 or as the phase comparator 234 in the TADC 230. Since the phase comparator 834 may be configured to include the phase comparator 634, and the plurality of FFs and the binary converter 640 in the phase comparator 834 are similar to corresponding constituent members of the phase comparator 634, description thereof will be omitted.

The phase comparator 834 includes a lock detection circuit 842, a frequency detection circuit 844, a frequency comparison circuit 850, and a selection circuit 862 in addition to the phase comparator 634 including the plurality of FFs and the binary converter 640. The lock detection circuit 842 is connected to the binary converter 640. The lock detection circuit 842 is an example of a determination circuit, and determines whether a phase difference detected by the phase comparator 634 has come out of a predetermined range.

The lock detection circuit 842 samples a phase difference signal P [3:0] (which corresponds to the TDC [3:0] in FIG. 6) outputted by the binary converter 640, at the timing of the output clock signal (XOCLK). It is assumed that the phase difference signal P [3:0] is one of six kinds of values −2.5, −1.5, −0.5, +0.5, +1.5, +2.5, and a predetermined range of a phase lock state is −1.5, −0.5, +0.5, +1.5. The lock detection circuit 842 determines that the internal clock signal (VCOCLK) is phase-locked to the output clock signal, in response to the phase difference signal P [3:0] falling within a range from −1.5 to +1.5 or to the phase difference signal P [3:0] falling within the range from −1.5 to +1.5 for a predetermined number (number of 2 or more) of cycles of the output clock signal. The lock detection circuit 842 determines that the internal clock signal is not phase-locked to the output clock signal, in response to the phase difference signal P [3:0] being out of the range from −1.5 to +1.5 or to the phase difference signal P [3:0] having come out of the range from −1.5 to +1.5 for the predetermined number (number of 2 or more) of cycles of the output clock signal.

The frequency detection circuit 844 is connected to the lock detection circuit 842. The frequency detection circuit 844 includes a counter 846 and a counter 848, and detects frequencies of the output clock signal and the internal clock signal in response to the phase difference detected by the phase comparator 634 having come out of the predetermined range. Count values outputted by the counter 846 and the counter 848 are reset to 0 if the internal clock signal is phase-locked to the output clock signal (if a LOCK signal outputted by the lock detection circuit 842=a RESET signal is 1). The counter 846 is incremented for each period of the internal clock signal if the internal clock signal is no more phase-locked to the output clock signal (the LOCK signal=the RESET signal is 0). The counter 848 is incremented for each period of the output clock signal if the internal clock signal is no more phase-locked to the output clock signal (the LOCK signal=the RESET signal is 0). As a result, the counter 846 and the counter 848 measure the number of pulses per time (that is, frequency) of the internal clock signal and the output clock signal.

Note that, if the internal clock signal is adjusted to have a frequency equivalent to an integer multiple of the frequency of the output clock signal by an integer equal to or greater than two, the counter 846 may receive the internal clock signal via a frequency divider which divides a frequency by an integer divide ratio, to perform count up. Alternatively, the frequency detection circuit 844 may multiply the count value outputted by the counter 848 by an integer multiple, to output the result to the frequency comparison circuit 850.

The frequency comparison circuit 850 is connected to the frequency detection circuit 844. The frequency comparison circuit 850 compares the frequency of the internal clock signal with the frequency of the output clock signal (frequency equivalent to an integer multiple of the frequency of the output clock signal). The frequency comparison circuit 850 includes a comparator 852, an amplifier 854, a comparator 856, an amplifier 858, and an adder 860. The comparator 852 determines whether the count value of the counter 846 is greater than the count value of the counter 848, that is, whether the frequency of the internal clock signal is higher than the frequency equivalent to the integer multiple of the frequency of the output clock signal. The amplifier 854 performs amplification by multiplying a comparison result from the comparator 852 by −2.5, to output a minimum value −2.5 of the phase difference signal if the frequency of the internal clock signal is higher than the frequency equivalent to the integer multiple of the frequency of the output clock signal.

The comparator 856 determines whether the count value of the counter 846 is equal to or smaller than the count value of the counter 848, that is, whether the frequency of the internal clock signal is equal to or lower than the frequency equivalent to the integer multiple of the frequency of the output clock signal. The amplifier 858 performs amplification by multiplying a comparison result from the comparator 856 by +2.5, to output a maximum value +2.5 of the phase difference signal if the frequency of the internal clock signal is equal to or lower than the frequency equivalent to the integer multiple of the frequency of the output clock signal. The adder 860 adds outputs of the amplifier 854 and the amplifier 858, to output a phase difference signal FCOMP [3:0] indicating the minimum value −2.5 or the maximum value +2.5. This phase difference signal FCOMP [3:0] indicates an amount by which a phase of the internal clock signal is to be delayed (or advanced), in relatively changing the phase of the internal clock signal with respect to the output clock signal in order to match a frequency to the frequency equivalent to the integer multiple of the frequency of the output clock signal.

The selection circuit 862 is connected to the binary converter 640 and the frequency comparison circuit 850. The selection circuit 862 selects the phase difference (phase difference signal P [3:0]) detected by the phase comparator 634 in response to the phase difference detected by the phase comparator 634 falling within the predetermined range (phase-locked state). In addition, the selection circuit 862 selects the phase difference (phase difference signal FCOMP [3:0]) decided according to a result of comparing the frequency equivalent to the integer multiple of the frequency of the output clock signal with the frequency of the internal clock signal in response to the phase difference detected by the phase comparator 634 having come out of the predetermined range (non phase-locked state). The selection circuit 862 outputs the selected phase difference signal as the phase difference signal TDC [3:0].

The clock generation apparatus 1 can, by using the phase comparator 834, output the phase difference signal FCOMP [3:0] which changes the phase difference such that the frequencies of the internal clock signal and the output clock signal are brought closer while the internal clock signal is not phase-locked to the output clock signal, and output the phase difference signal P [3:0] which reduces the phase difference between the internal clock signal and the output clock signal when the internal clock signal is phase-locked to the output clock signal. The second VCO 232 receives an analog temperature signal from the temperature sensor 125 and, via the loop filter 236, the phase difference signal selected by the selection circuit 862, and outputs the internal clock signal with a frequency according to the received phase difference. As a result, even if there is a large difference between the frequency of the internal clock signal and the frequency equivalent to the integer multiple of the frequency of the output clock signal, the clock generation apparatus 1 can adjust and phase-lock the frequencies of the internal clock signal and the output clock signal.

Figure 9:
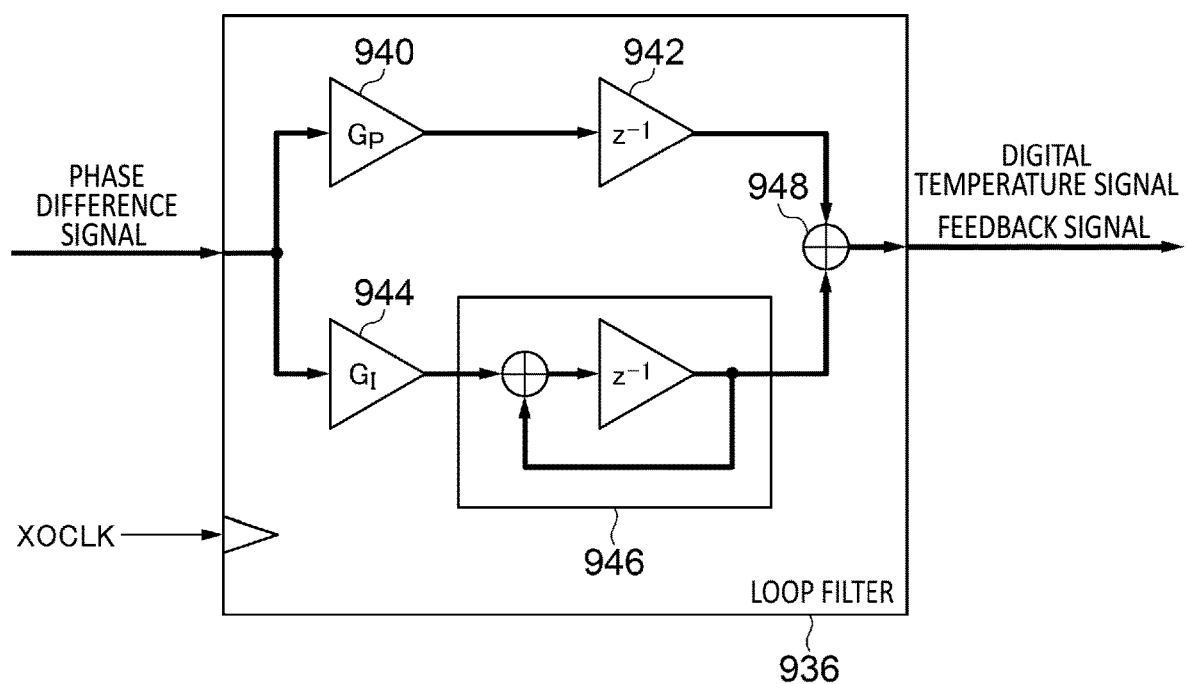
FIG. 9 shows a configuration of a loop filter 936 according to the present embodiment.

FIG. 9 shows a configuration of a loop filter 936 according to the present embodiment. The clock generation apparatus 1 may use the loop filter 936 as the loop filter 236 in the TADC 230. The loop filter 936 includes an amplifier 940, a delay element 942, an amplifier 944, an integrator 946, and an adder 948.

The amplifier 940 amplifies the phase difference signal TDC [3:0] with a gain $G_p$. The delay element 942 is connected to the amplifier 940. The delay element 942 samples a signal outputted by the amplifier 940, at the timing of an output clock signal.

The amplifier 944 amplifies the phase difference signal TDC [3:0] with a gain $G_I$. The integrator 946 is connected to the amplifier 944. The integrator 946 integrates a signal outputted by the amplifier 944, at each timing of the output clock signal. The integrator 946 may add an output value of the amplifier 944 in a current cycle to an integrated value in the current cycle of the output clock signal, to obtain the integrated value in a next cycle. Alternatively, the integrator 946 may add the output value of the amplifier 944 in the current cycle to the integrated value in the current cycle of the output clock signal which has been attenuated through multiplication by a predetermined attenuation factor (positive factor less than 1.0), to obtain the integrated value in the next cycle.

The adder 948 adds outputs of the delay element 942 and the integrator 946, to output the result as a digital temperature signal and a feedback signal to the second VCO 232. The loop filter 936 described above functions as a PI feedback circuit having: a proportional path including the amplifier 940 and the delay element 942; and an integral path including the amplifier 944 and the integrator 946.

Figure 10:
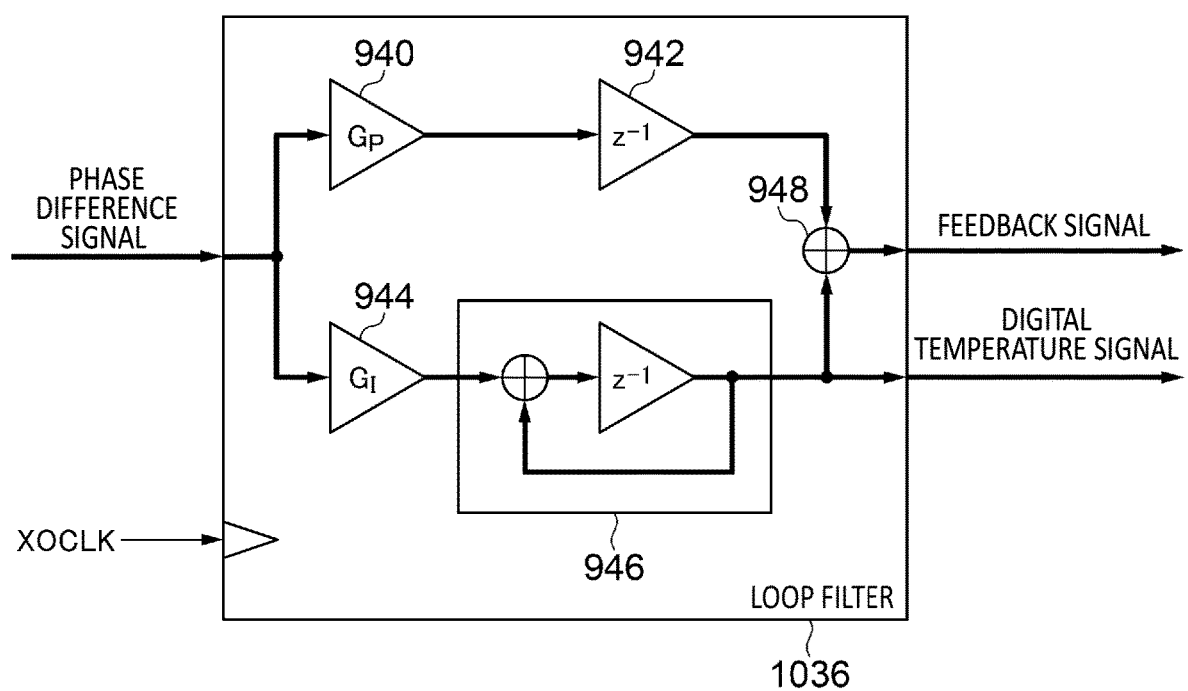
FIG. 10 shows a configuration of a loop filter 1036 according to a modified example.

FIG. 10 shows a configuration of a loop filter 1036 according to a modified example. The clock generation apparatus 1 may use the loop filter 1036 as the loop filter 236 in the TADC 230. The loop filter 1036 includes the amplifier 940, the delay element 942, the amplifier 944, the integrator 946, and the adder 948, similarly to the loop filter 936. As shown in the present figure, the loop filter 1036 may output a digital temperature signal from an intermediate node in the loop filter 1036 (an output node of the integrator 946 in the example of the present figure) instead of using, as the digital temperature signal as well, a feedback signal which is a final output of the loop filter 1036.

Figure 11:
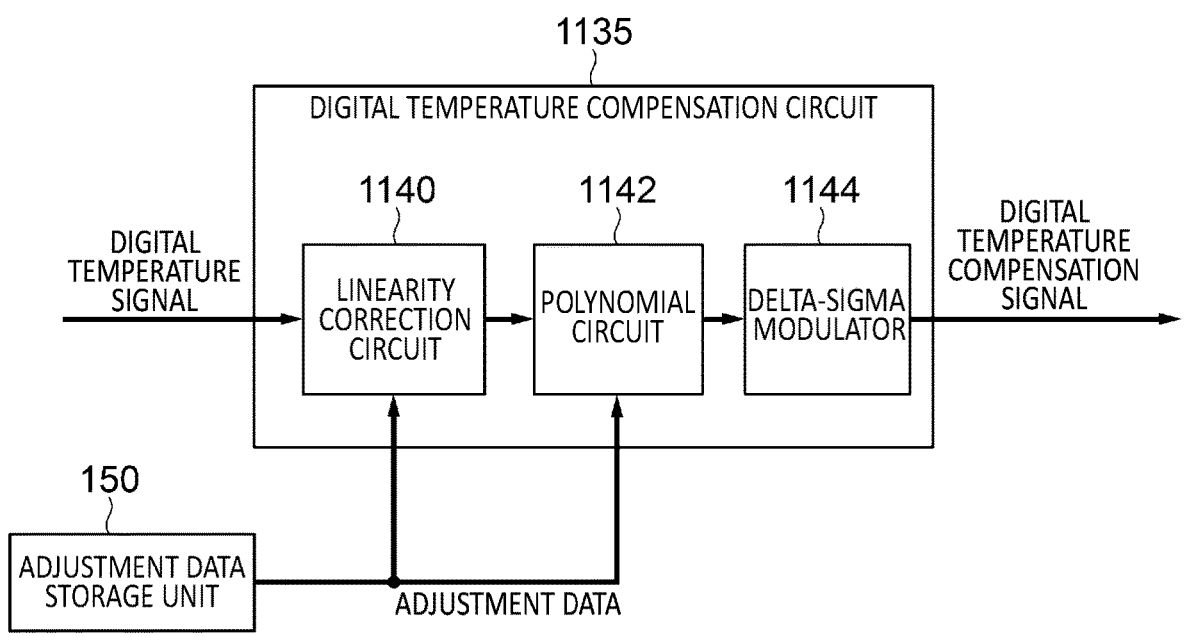
FIG. 11 shows a configuration of a digital temperature compensation circuit 1135 according to the present embodiment.

FIG. 11 shows a configuration of a digital temperature compensation circuit 1135 according to the present embodiment. The clock generation apparatus 1 may use the digital temperature compensation circuit 1135 as the digital temperature compensation circuit 135. The digital temperature compensation circuit 1135 includes a linearity correction circuit 1140, a polynomial circuit 1142, and a delta-sigma modulator 1144.

The linearity correction circuit 1140 linearly corrects a digital temperature signal. The polynomial circuit 1142 is connected to the linearity correction circuit 1140. The polynomial circuit 1142 outputs a signal obtained by performing polynomial transformation on the linearly corrected digital temperature signal. The delta-sigma modulator 1144 converts the signal outputted by the polynomial circuit 1142, to output it as a digital temperature compensation signal. The delta-sigma modulator 1144 may be a delta-sigma converter such as a MASH-111, as an example.

Figure 12:
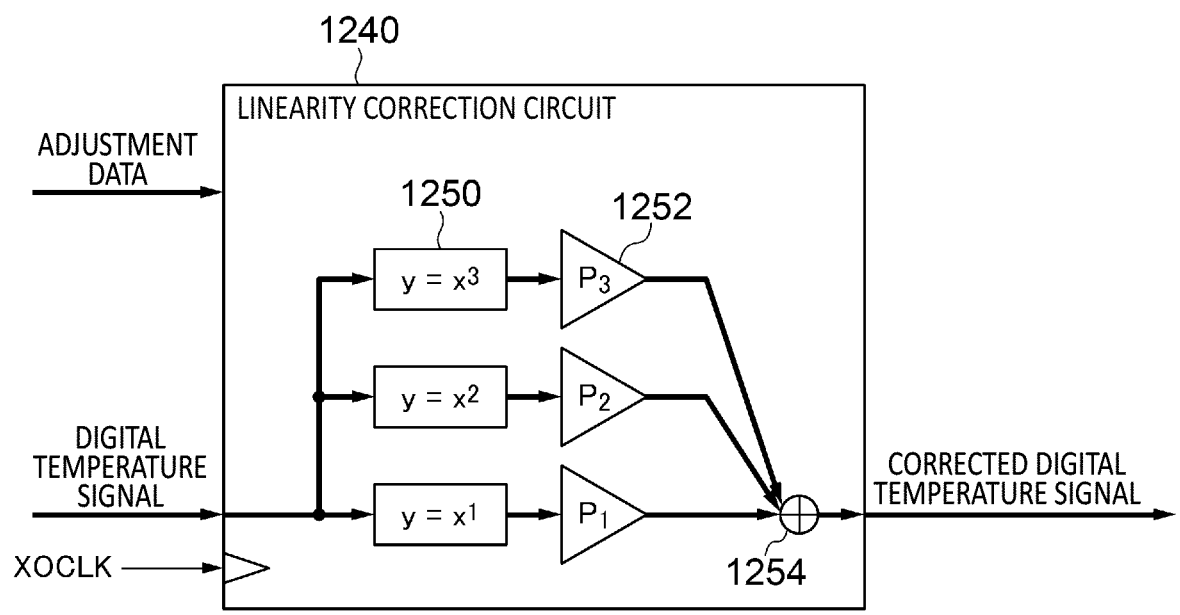
FIG. 12 shows a configuration of a linearity correction circuit 1240 according to the present embodiment.

FIG. 12 shows a configuration of a linearity correction circuit 1240 according to the present embodiment. The clock generation apparatus 1 may use the linearity correction circuit 1240 as the linearity correction circuit 1140 in the digital temperature compensation circuit 1135. The linearity correction circuit 1240 operates in synchronization with an output clock signal. The linearity correction circuit 1240 includes a plurality of exponentiators 1250, a plurality of amplifiers 1252, and an adder 1254. The plurality of exponentiators 1250 calculate a plurality of exponentiation values obtained by exponentiating a digital temperature signal with a plurality of orders (values obtained by raising the digital temperature signal to the first power, the second power, the third power, and the like). The plurality of amplifiers 1252 multiply the plurality of exponentiation values of the digital temperature signal by a plurality of gains (P1, P2, P3, and the like), respectively. The adder 1254 adds outputs of the plurality of amplifiers 1252, to output the result as a corrected digital temperature signal.

The linearity correction circuit 1240 shown in FIG. 12 outputs the digital temperature signal which has been linearly corrected by correcting the digital temperature signal with a cubic function. Alternatively, the linearity correction circuit 1240 may use an M-th order function of a different order as a correction function, or may use any function other than the M-th order function as the correction function. Note that the linearity correction circuit 1240 may use, as parameters (for example, the plurality of gains $P_1$ to $P_3$) of the correction function, one or more adjustment parameters included in adjustment data stored in the adjustment data storage unit 150.

Figure 13:
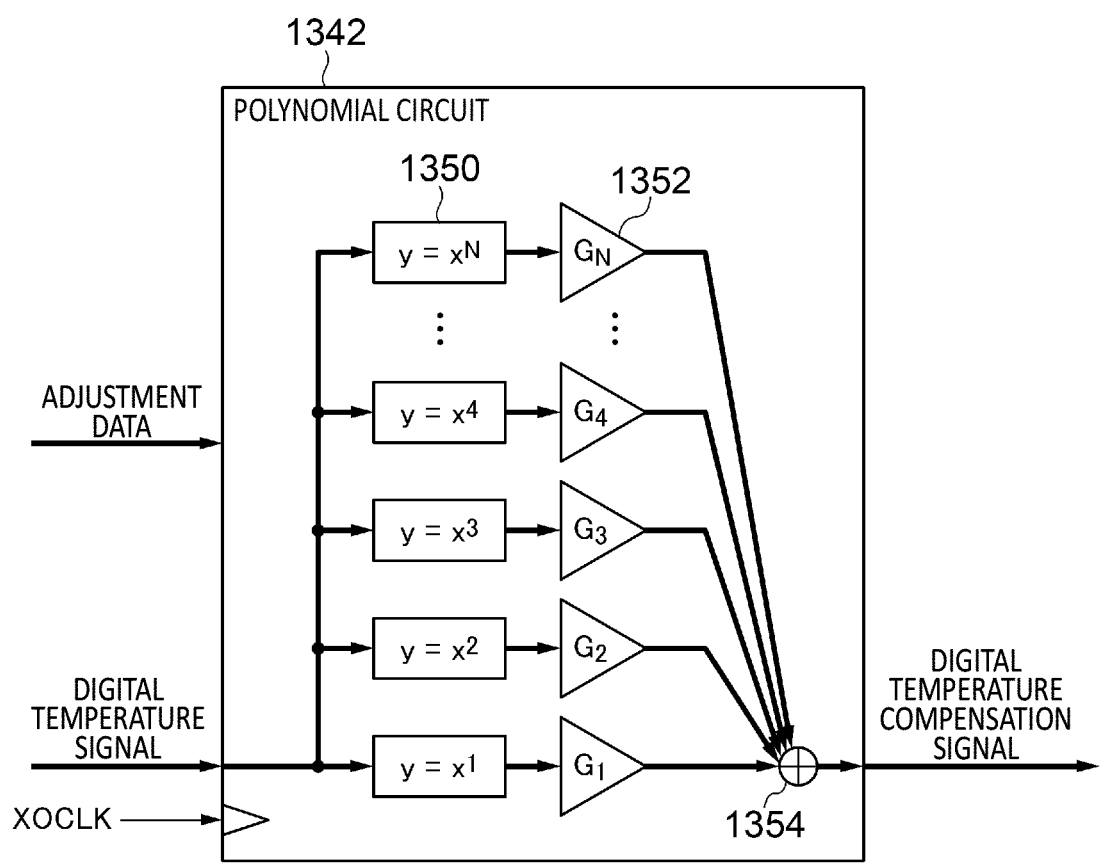
FIG. 13 shows a configuration of a polynomial circuit 1342 according to the present embodiment.

FIG. 13 shows a configuration of a polynomial circuit 1342 according to the present embodiment. The clock generation apparatus 1 may use the polynomial circuit 1342 as the polynomial circuit 1142 in the digital temperature compensation circuit 1135. The polynomial circuit 1342 converts a digital temperature signal to a digital temperature compensation signal in synchronization with an output clock signal. The polynomial circuit 1342 includes a plurality of exponentiators 1350, a plurality of amplifiers 1352, and an adder 1354. The plurality of exponentiators 1350 calculate a plurality of exponentiation values obtained by exponentiating the digital temperature signal from the linearity correction circuit 1140 with a plurality of orders (values obtained by raising the digital temperature signal to the first power, the second power, . . . , the N-th power, and the like). The plurality of amplifiers 1352 multiply the plurality of exponentiation values of the digital temperature signal by a plurality of gains ($G_1$, $G_2$, . . . , $G_N$, and the like), respectively. The adder 1354 adds outputs of the plurality of amplifiers 1352, to output the result as the digital temperature compensation signal.

The polynomial circuit 1342 shown in FIG. 13 converts the digital temperature signal to the digital temperature compensation signal with an N-th order function. The polynomial circuit 1342 may use the N-th order function of any order as a compensation function for temperature compensation, or may use any function other than the N-th order function as the compensation function. For example, the polynomial circuit 1342 may be replaced with a spline circuit which uses an N-th order spline function as the compensation function. Note that the polynomial circuit 1342 may use, as parameters (for example, the plurality of gains $G_1$ to $G_N$) of the compensation function, one or more adjustment parameters included in adjustment data stored in the adjustment data storage unit 150.

Figure 14:
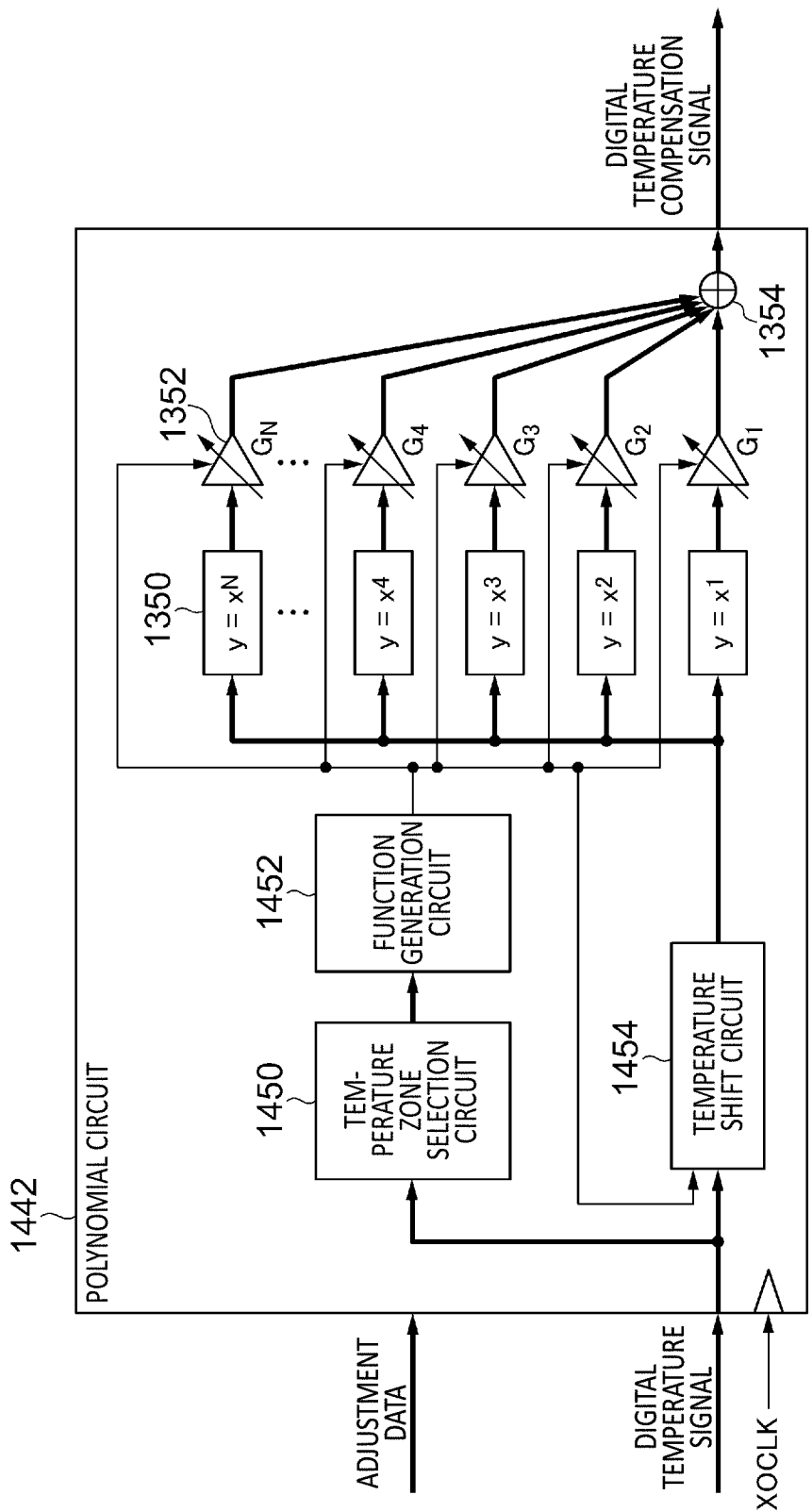
FIG. 14 shows a configuration of a polynomial circuit 1442 according to a modified example.

FIG. 14 shows a configuration of a polynomial circuit 1442 according to a modified example. The clock generation apparatus 1 may use the polynomial circuit 1442 instead of the polynomial circuit 1342 as the polynomial circuit 1142 in the digital temperature compensation circuit 1135. The polynomial circuit 1442 converts a digital temperature signal to a digital temperature compensation signal by using a compensation function associated with each of a plurality of temperature zones into which a predetermined temperature range is divided. As a result, the digital temperature compensation circuit 1135 can compensate a frequency of an output clock signal by using the compensation function associated with each of the plurality of temperature zones.

The polynomial circuit 1442 converts the digital temperature signal to the digital temperature compensation signal in synchronization with the output clock signal. The polynomial circuit 1442 includes the plurality of exponentiators 1350, the plurality of amplifiers 1352, the adder 1354, a temperature zone selection circuit 1450, a function generation circuit 1452, and a temperature shift circuit 1454. Since the plurality of exponentiators 1350, the plurality of amplifiers 1352, and the adder 1354 are similar to the plurality of exponentiators 1350, the plurality of amplifiers 1352, and the adder 1354 in FIG. 13, description thereof will be omitted except for the following differences.

The temperature zone selection circuit 1450 selects a temperature zone to be used from among a plurality of temperature zones according to the digital temperature signal. The function generation circuit 1452 is connected to the temperature zone selection circuit 1450. The function generation circuit 1452 generates a compensation function which uses a parameter according to the temperature zone selected by the temperature zone selection circuit 1450. The function generation circuit 1452 in the present modified example supplies each of the plurality of amplifiers 1352 with a gain to be set in each of the plurality of amplifiers 1352 according to the selected temperature zone. In addition, the function generation circuit 1452 outputs a temperature shift amount by which the digital temperature signal should be shifted according to the selected temperature zone.

The temperature shift circuit 1454 is connected to the function generation circuit 1452. The temperature shift circuit 1454 shifts the digital temperature signal by the temperature shift amount received from the function generation circuit 1452. As a result, no matter which temperature zone includes a temperature value indicated by the digital temperature signal, the temperature shift circuit 1454 can convert the digital temperature signal such that a minimum temperature value in the temperature zone is a reference value (for example, 0). This temperature shift operation eliminates a need to prepare a separate exponentiator 1350 for each temperature zone, and can prevent an increase in circuit area.

The polynomial circuit 1442 generates the digital temperature compensation signal with the plurality of exponentiators 1350, the plurality of amplifiers 1352, and the adder 1354 by using the compensation function generated by the function generation circuit 1452. The polynomial circuit 1442 controls a frequency of the output clock signal of the first VCO 120 by supplying the generated digital temperature compensation signal to the first VCO 120 via the VDAC 140 and the LPF 145.

FIG. 15 shows a setting for each temperature zone in the polynomial circuit 1442. The function generation circuit 1452 outputs, by using this setting, a plurality of compensation gains and a temperature shift amount corresponding to the temperature zone selected by the temperature zone selection circuit 1450. In the example of the present figure, a temperature compensation range of the clock generation apparatus 1 is from −40 degrees C. to +105 degrees C. The temperature compensation range of the clock generation apparatus 1 is divided into five temperature zones 1 to 5.

The temperature zone 1 ranges from −40 degrees C. to −11 degrees C. The temperature shift amount of 0 and the compensation gains $G_{11}$, $G_{12}$, ..., $G_{1N}$ of each order to be set in each amplifier 1352 are associated with the temperature zone 1.

The temperature zone 2 ranges from −11 degrees C. to +18 degrees C. The temperature shift amount of 29 and the compensation gains $G_{21}$, $G_{22}$, ..., $G_{2N}$ of each order to be set in each amplifier 1352 are associated with the temperature zone 2. In the temperature zone 2, the temperature shift circuit 1454 subtracts the temperature shift amount of 29 from temperature indicated by a digital temperature signal. For example, if the digital temperature signal takes a value being 0 at −40 degrees C. and increasing by 1 for each 1 degree C. increase in the temperature, the digital temperature signal is 29 at −11 degrees C. In this case, the temperature shift circuit 1454 converts −11 degrees C. in the temperature zone 2 to 0 by subtracting 29 from the digital temperature signal in the temperature zone 2. The temperature shift circuit 1454 can convert minimum temperature in all temperature zones to the same reference value (for example, 0) by similarly shifting the digital temperature signal in another temperature zone.

The temperature zone 3 ranges from +18 degrees C. to +47 degrees C. The temperature shift amount of 58 and the compensation gains $G_{31}$, $G_{32}$, ..., $G_{3N}$ of each order to be set in each amplifier 1352 are associated with the temperature zone 3.

The temperature zone 4 ranges from +47 degrees C. to +76 degrees C. The temperature shift amount of 87 and the compensation gains $G_{41}$, $G_{42}$, ..., $G_{4N}$ of each order to be set in each amplifier 1352 are associated with the temperature zone 4.

The temperature zone 5 ranges from +76 degrees C. to +105 degrees C. The temperature shift amount of 116 and the compensation gains $G_{51}$, $G_{52}$, ..., $G_{5N}$ of each order to be set in each amplifier 1352 are associated with the temperature zone 5.

Figure 16:
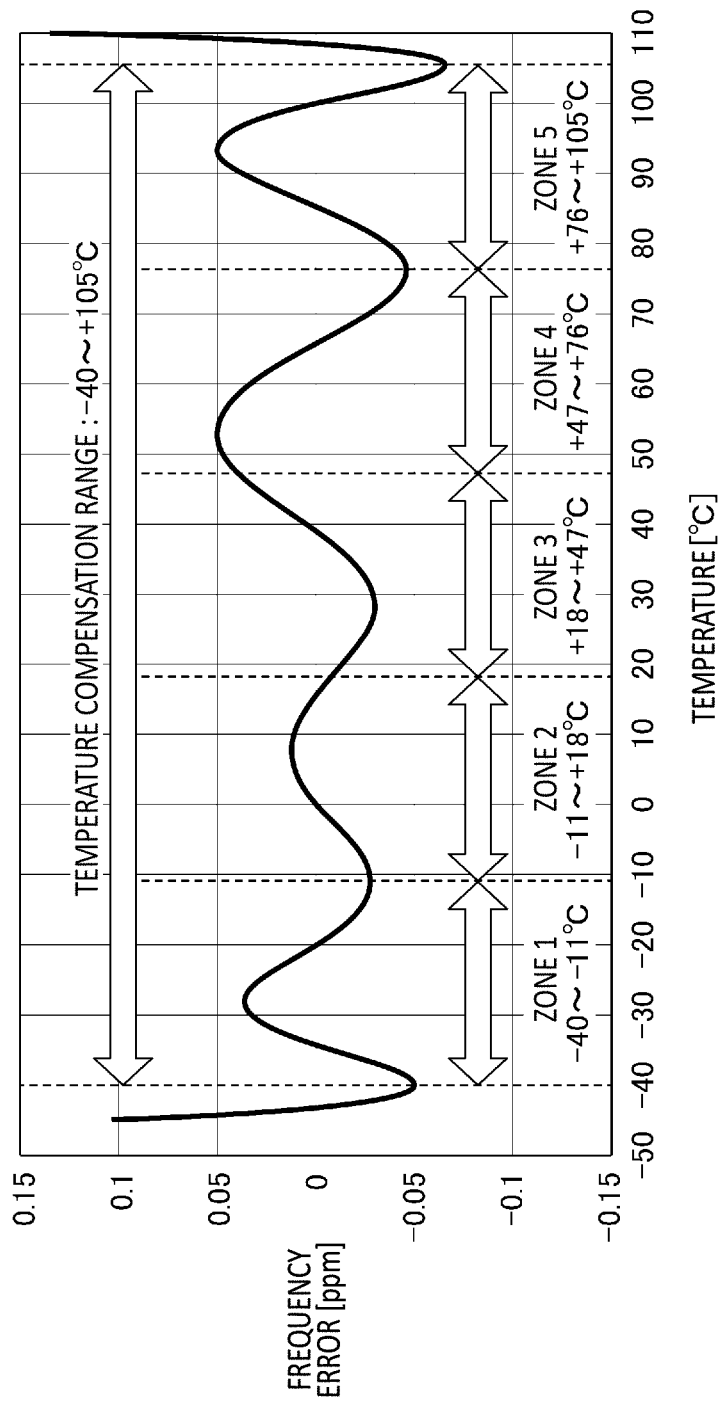
FIG. 16 shows an example of a frequency error characteristic of the clock generation apparatus 1.

FIG. 16 shows an example of a frequency error characteristic of the clock generation apparatus 1. The horizontal axis of a graph shown in the present figure represents temperature and the vertical axis represents a frequency error (ppm). If temperature compensation is not performed, the frequency error of the clock generation apparatus 1 may have many extreme values and inflection points within a temperature compensation range (from −40 degrees C. to +105 degrees C.) of the clock generation apparatus 1. The polynomial circuit 1442 divides the temperature compensation range into a plurality of temperature zones to generate a compensation function associated with each temperature zone, thereby reducing the number of extreme values and inflection points included in an individual temperature zone to allow the compensation function of a lower order to be used to increase accuracy of the temperature compensation.

Figure 17:
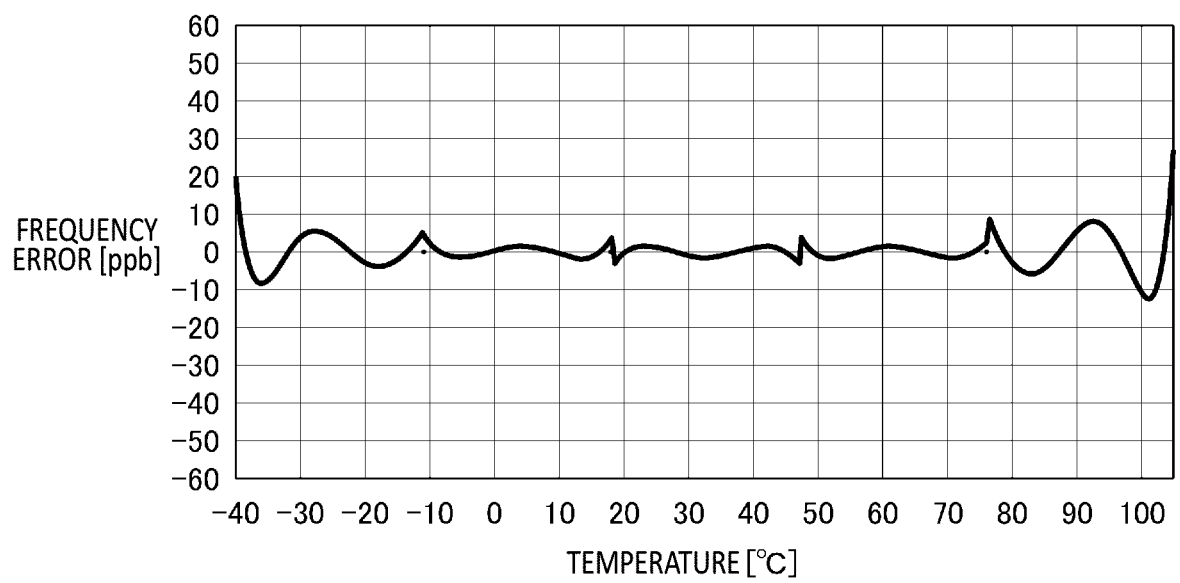
FIG. 17 shows an example of a frequency error characteristic after digital temperature compensation.

FIG. 17 shows an example of a frequency error characteristic after digital temperature compensation. The horizontal axis of a graph shown in the present figure represents temperature, and the vertical axis represents a frequency error (ppb). When a compensation function is assigned to each of the temperature zones into which a temperature compensation range (from −40 degrees C. to +105 degrees C.) is divided as shown in FIG. 15, the polynomial circuit 1442 can reduce the frequency error throughout the temperature compensation range.

Here, when trying to perform temperature compensation for each temperature zone by dividing the temperature compensation range with an analog temperature compensation circuit, a compensation component of an adjacent temperature zone leaks out near a boundary of the temperature zone, which makes it difficult to perform accurate temperature compensation. The clock generation apparatus 1 can assign the compensation function to each of the temperature zones into which the temperature compensation range is divided, by generating a digital temperature compensation signal though digital processing by the polynomial circuit 1442 by using a digital temperature signal converted from analog to digital by the TADC 130.

Figure 18:
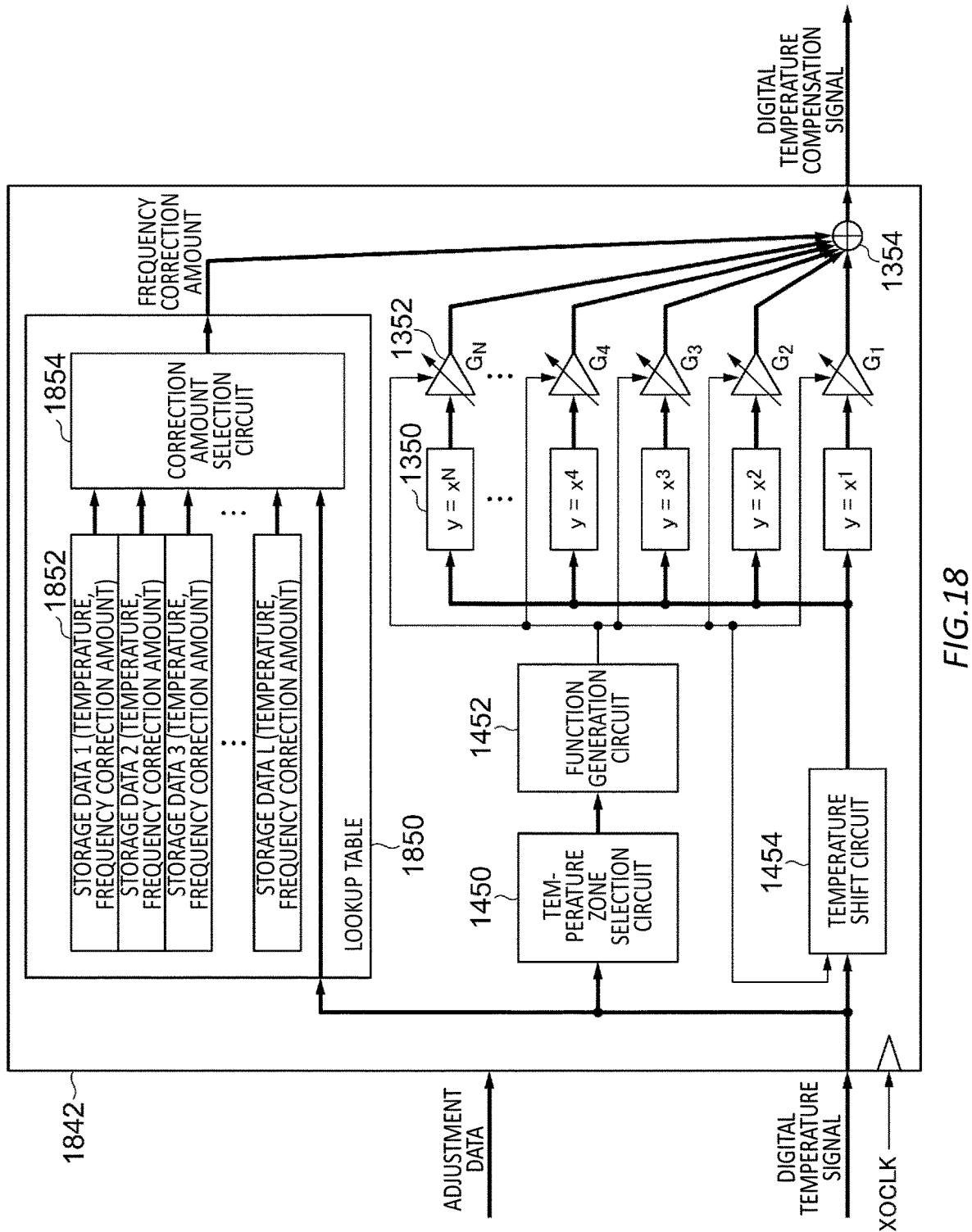
FIG. 18 shows a configuration of a polynomial circuit 1842 according to a modified example.

FIG. 18 shows a configuration of a polynomial circuit 1842 according to a modified example. The clock generation apparatus 1 may use the polynomial circuit 1842 instead of the polynomial circuit 1342 and the polynomial circuit 1442 as the polynomial circuit 1142 in the digital temperature compensation circuit 1135. The polynomial circuit 1842 controls a frequency of an output clock signal of the first VCO 120 by using a temperature compensation value stored in a lookup table, in response to a digital temperature signal indicating temperature of a boundary portion between temperature zones.

The polynomial circuit 1842 includes a lookup table 1850 in addition to each member of the polynomial circuit 1442 shown in FIG. 14. Since a function and a configuration of each member in the polynomial circuit 1842 which is assigned the same reference numeral as in the polynomial circuit 1442 are similar to those of a corresponding member in the polynomial circuit 1442, description thereof will be omitted except for the following differences.

The lookup table 1850 includes a storage region 1852 and a correction amount selection circuit 1854. The storage region 1852 stores a frequency correction amount at temperature of a boundary portion between adjacent temperature zones in association with the temperature. The storage region 1852 stores the frequency correction amount in association with each of a plurality of (for example, L (L>2)) values of the digital temperature signal.

The correction amount selection circuit 1854 is connected to the storage region 1852. If a value of the digital temperature signal matches any temperature value in the storage region 1852, the correction amount selection circuit 1854 outputs the frequency correction amount (temperature compensation value) associated with the temperature value. If the value of the digital temperature signal does not match any temperature value in the storage region 1852, the correction amount selection circuit 1854 outputs the frequency correction amount of 0.

The adder 1354 adds outputs of the plurality of amplifiers 1352 and the frequency correction amount outputted by the correction amount selection circuit 1854, to output the result as a digital temperature compensation signal. As a result, the polynomial circuit 1842 can control the frequency of the output clock signal by using the temperature compensation value stored in the lookup table 1850, if the digital temperature signal is a certain value.

Note that, in the polynomial circuit 1842 described above, the lookup table 1850 outputs the temperature compensation value being as an adjustment value to be added to a value of a compensation function which uses the plurality of exponentiators 1350 and the plurality of amplifiers 1352. Alternatively, the polynomial circuit 1842 may disable the compensation function such as by disabling or zeroing outputs from the plurality of amplifiers 1352 at certain temperature registered in the storage region 1852, and output, as a value of the digital temperature compensation signal, the temperature compensation value outputted by the lookup table 1850.

In addition, the lookup table 1850 described above stores a plurality of sets of the temperature and the frequency correction amount, and functions as an associative memory which outputs the frequency correction amount corresponding to the temperature indicated by the digital temperature signal. Alternatively, the lookup table 1850 may have a storage region addressed near a boundary of a temperature zone, and output, in response to the temperature indicated by the digital temperature signal being inputted as an address, the frequency correction amount stored in the address.

Figure 19:
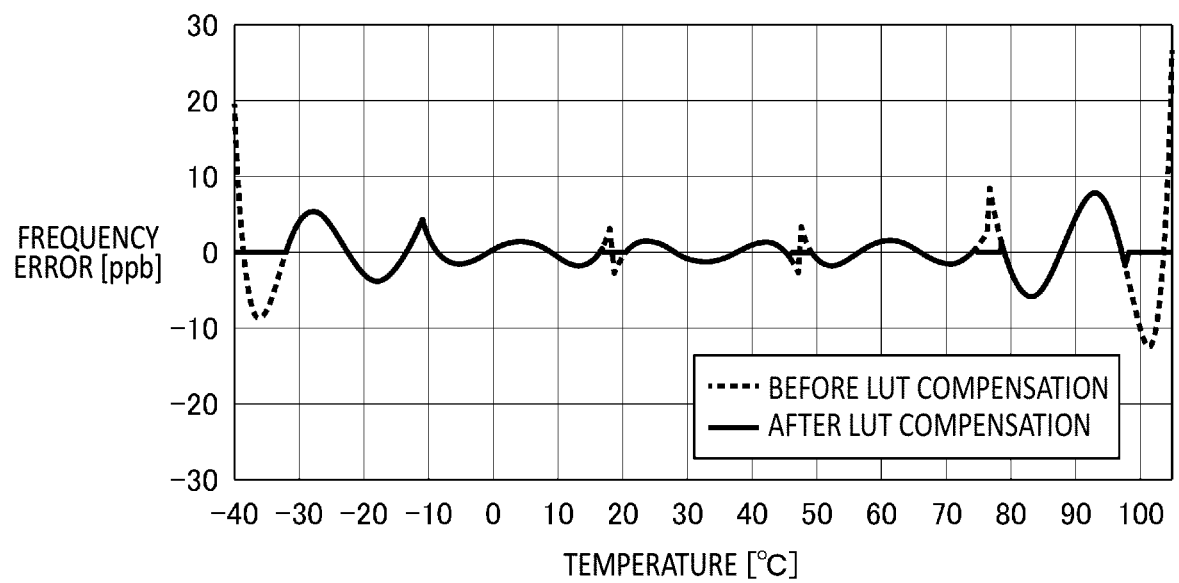
FIG. 19 shows an example of a frequency error characteristic after digital temperature compensation with an LUT.

FIG. 19 shows an example of a frequency error characteristic after digital temperature compensation with a lookup table (LUT). The horizontal axis of a graph shown in the present figure represents temperature, and the vertical axis represents a frequency error (ppb). In the present figure, a dashed line indicates the frequency error characteristic for a case where the lookup table is not used, which is the same as the frequency error characteristic in FIG. 17. A solid line indicates the frequency error characteristic for a case where the lookup table is further used. The polynomial circuit 1842 can use a temperature compensation value stored in the lookup table 1850 if a digital temperature signal indicates temperature of a boundary portion between temperature zones, thereby reducing a frequency temperature slope in the boundary portion between the temperature zones to suppress discontinuity and reducing the frequency error.

Figure 20:
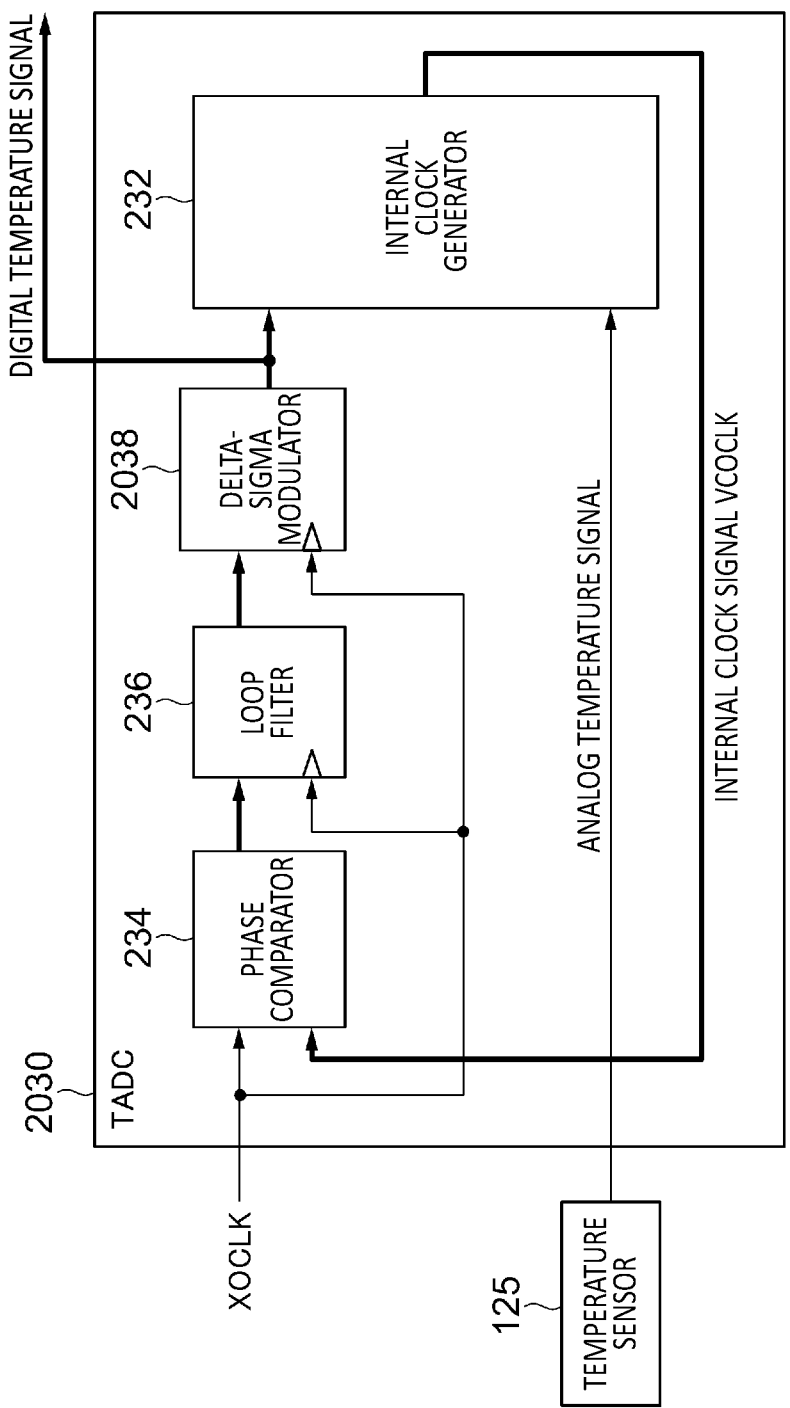
FIG. 20 shows a configuration of a TADC 2030 according to a modified example.

FIG. 20 shows a configuration of a TADC 2030 according to a modified example. The clock generation apparatus 1 may use the TADC 2030 instead of the TADC 230. Since the TADC 2030 is a modified example of the TADC 230, a member having a function and a configuration similar to those of the TADC 230 is assigned the same reference numeral as the reference numeral in the TADC 230, and description thereof will be omitted except for the following differences.

The TADC 2030 further includes a delta-sigma modulator 2038 in addition to each member of the TADC 230. The delta-sigma modulator 2038 modulates, by delta-sigma modulation, a phase difference signal according to a phase difference between an output clock signal and an internal clock signal (or a signal based on the phase difference signal), to output it to the second VCO 232.

Since the second VCO 232 discretely responds to a digital feedback signal, in the TADC 230 which is not provided with the delta-sigma modulator 2038, periodic operation involved with a discrete response of the second VCO 232 may cause a spurious peak in a frequency spectrum of a digital temperature signal. In the TADC 2030, converting an output of the loop filter 236 with the delta-sigma modulator 2038 can spread spurious and reduce the spurious peak.

Figure 21:
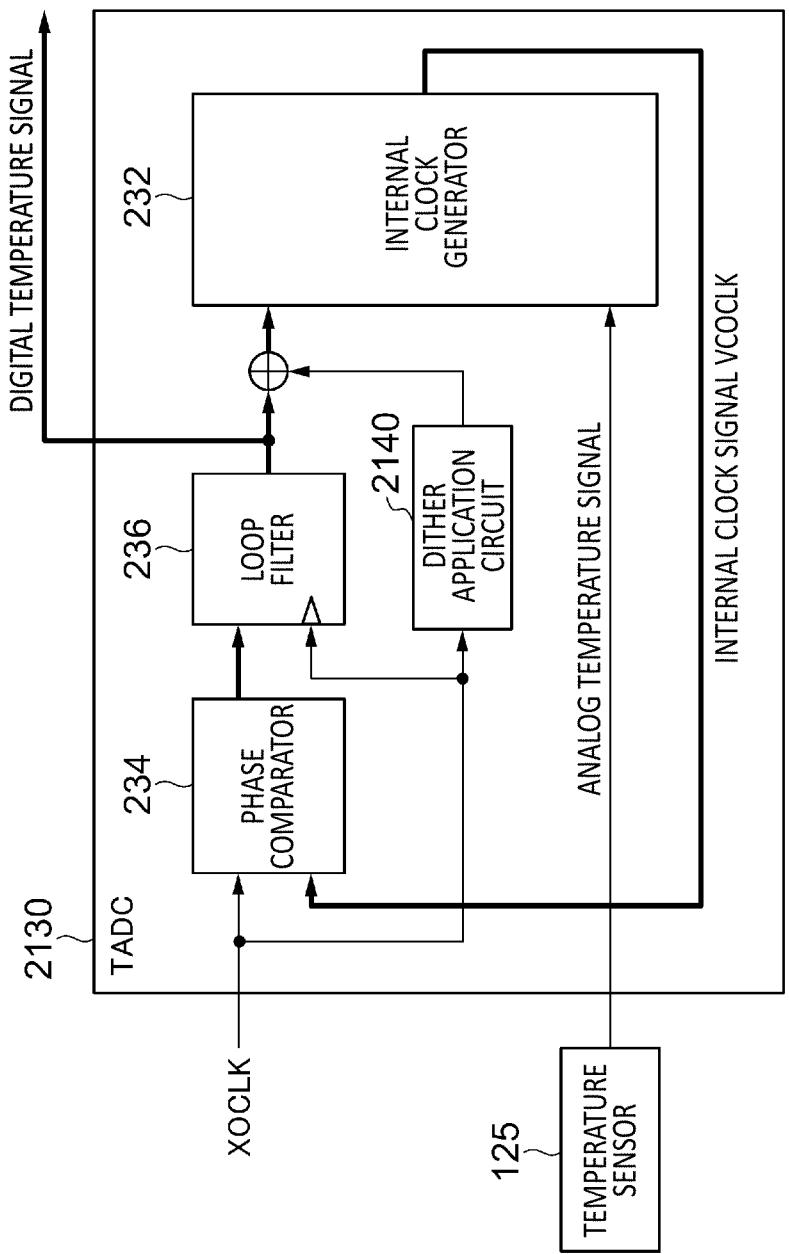
FIG. 21 shows a configuration of a TADC 2130 according to another modified example.

FIG. 21 shows a configuration of a TADC 2130 according to another modified example. The clock generation apparatus 1 may use the TADC 2130 instead of the TADC 230. Since the TADC 2130 is a modified example of the TADC 230, a member having a function and a configuration similar to those of the TADC 230 is assigned the same reference numeral as the reference numeral in the TADC 230, and description thereof will be omitted except for the following differences.

The TADC 2130 further includes a dither application circuit 2140 in addition to each member of the TADC 230. The dither application circuit 2140 applies dither to a phase difference signal according to a phase difference between an output clock signal and an internal clock signal (or a signal based on the phase difference signal), to output the signal to the second VCO 232.

As shown in connection with FIG. 20, the TADC 230 may have a spurious peak generated in a frequency spectrum of a digital temperature signal. In the TADC 2130, the dither application circuit 2140 applies the dither having a pseudorandom pattern to the phase difference signal filtered by the loop filter 236 (a signal based on the phase difference signal). The dither application circuit 2140 may be a circuit which uses a linear feedback shift register such as a Fibonacci linear feedback shift register (LFSR), as an example. In the TADC 2130, applying the dither to an output of the loop filter 236 can spread a spurious generated in the digital temperature signal, and reduce the spurious peak.

Figure 22:
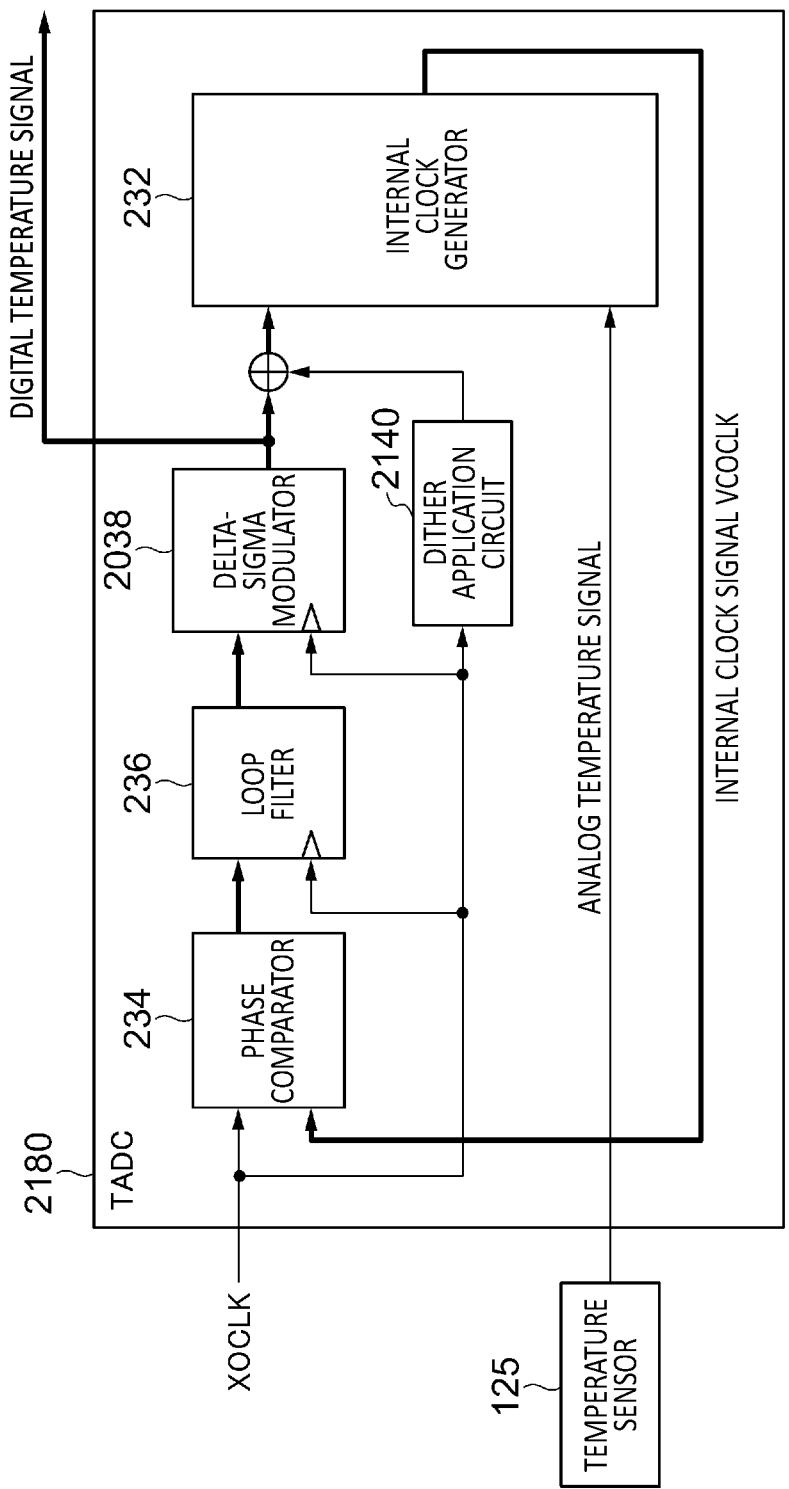
FIG. 22 shows a configuration of a TADC 2180 according to yet another modified example.

FIG. 22 shows a configuration of a TADC 2180 according to yet another modified example. The clock generation apparatus 1 may use the TADC 2180 instead of the TADC 230. Since the TADC 2180 is a modified example of the TADC 230, the TADC 2030, and the TADC 2130, a member having a function and a configuration similar to those of the TADC 230, the TADC 2030, and the TADC 2130 is assigned the same reference numeral as the reference numeral in the TADC 230, the TADC 2030, and the TADC 2130, and description thereof will be omitted except for the following differences.

The TADC 2180 includes both the delta-sigma modulator 2038 shown in FIG. 20 and the dither application circuit 2140 shown in FIG. 21 in addition to each member of the TADC 230. As shown in connection with FIG. 20, the delta-sigma modulator 2038 can suppress a spurious peak of a digital temperature signal. However, an output of the delta-sigma modulator 2038 may have a broad based idle tone involved with periodic operation for quantization by the delta-sigma modulator 2038. The TADC 2180 can further include the dither application circuit 2140 in addition to the delta-sigma modulator 2038, thereby spreading the idle tone generated by the delta-sigma modulator 2038, to suppress the spurious peak due to the idle tone.

Figure 23:
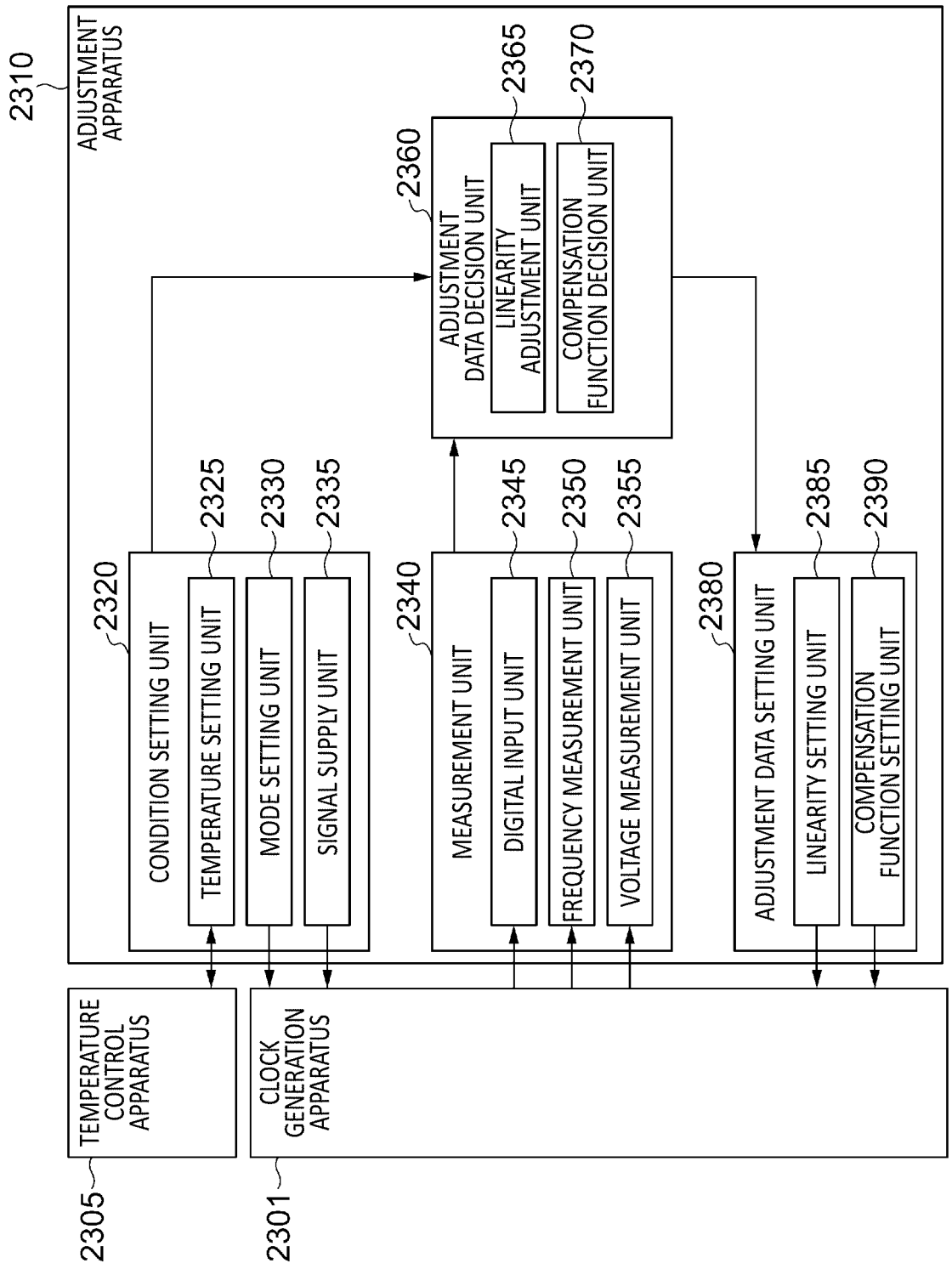
FIG. 23 shows a configuration of an adjustment apparatus 2310 according to the present embodiment.

FIG. 23 shows a configuration of an adjustment apparatus 2310 according to the present embodiment together with a clock generation apparatus 2301 and a temperature control apparatus 2305. The clock generation apparatus 2301 may be one of the clock generation apparatuses 1 shown in FIG. 1 to FIG. 22, or may be another clock generation apparatus. In the present embodiment, for explanatory convenience, description will be made taking as an example a case where the clock generation apparatus 2301 is the clock generation apparatus 1. The clock generation apparatus 2301 may have a function of compensating a frequency of an output clock signal by using a compensation function associated with each of a plurality of temperature zones into which a predetermined temperature range is divided. The clock generation apparatus 2301 may have one or more adjustable components, and may have an adjustment mode for adjusting a target component to be adjusted.

The temperature control apparatus 2305 controls temperature of the clock generation apparatus 2301 during adjustment of the clock generation apparatus 2301. The temperature control apparatus 2305 may have a heater, a cooler, and the like for setting the temperature of the clock generation apparatus 2301 to a target temperature.

The adjustment apparatus 2310 is connected to the clock generation apparatus 2301 such as at the time of inspection before or after shipment of the clock generation apparatus 2301 from a factory, and adjusts the clock generation apparatus 2301. The adjustment apparatus 2310 may be realized by adding, to a computer, an input/output interface which connects to the clock generation apparatus 2301 and the temperature control apparatus 2305. Such a computer functions as the adjustment apparatus 2310 by performing an adjustment program for adjusting the clock generation apparatus 2301. The adjustment apparatus 2310 includes a condition setting unit 2320, a measurement unit 2340, an adjustment data decision unit 2360, and an adjustment data setting unit 2380.

The condition setting unit 2320 sets an adjustment condition (temperature, an adjustment mode, a signal used for adjustment) under which the clock generation apparatus 2301 is adjusted. The condition setting unit 2320 has a temperature setting unit 2325, a mode setting unit 2330, and a signal supply unit 2335. The temperature setting unit 2325 brings the temperature of the clock generation apparatus 2301 to the target temperature by setting the target temperature of the clock generation apparatus 2301 in the temperature control apparatus 2305.

The mode setting unit 2330 sets, in the clock generation apparatus 2301, the adjustment mode for adjusting a component to be adjusted which is in the clock generation apparatus 2301. The signal supply unit 2335 supplies the clock generation apparatus 2301 with a signal used for the adjustment of the clock generation apparatus 2301.

The measurement unit 2340 measures an operation state of the clock generation apparatus 2301 under the adjustment condition set by the condition setting unit 2320. The measurement unit 2340 has a digital input unit 2345, a frequency measurement unit 2350, and a voltage measurement unit 2355. The digital input unit 2345 inputs a digital value (digital temperature signal or the like) outputted by a circuit in the clock generation apparatus 2301 in the adjustment mode.

The frequency measurement unit 2350 measures a frequency of a clock signal (output clock signal, internal clock signal outputted in the adjustment mode, or the like) outputted by the clock generation apparatus 2301. The frequency measurement unit 2350 may measure the frequency of the clock signal by measuring the number of clock pulses outputted by the clock generation apparatus 2301 within a unit time (one second, ten seconds, or the like). Alternatively, the frequency measurement unit 2350 may include a PLL which locks to a phase of a clock outputted by the clock generation apparatus 2301, and calculate a frequency conversion value from the PLL control signal. The voltage measurement unit 2355 measures a voltage (output voltage of the VDAC 140 or the like) outputted by the clock generation apparatus 2301 in the adjustment mode.

The adjustment data decision unit 2360 decides adjustment data for adjusting the clock generation apparatus 2301, based on the adjustment condition set by the condition setting unit 2320 and a measurement result from the measurement unit 2340. The adjustment data decision unit 2360 has a linearity adjustment unit 2365 and a compensation function decision unit 2370.

The linearity adjustment unit 2365 decides adjustment data for adjusting linearity of an input/output characteristic of a circuit to be adjusted. The compensation function decision unit 2370 decides a compensation function for compensating the frequency of the output clock signal of the clock generation apparatus 2301.

The adjustment data setting unit 2380 sets, in the clock generation apparatus 2301, the adjustment data decided by the adjustment data decision unit 2360. The adjustment data setting unit 2380 has a linearity setting unit 2385 and a compensation function setting unit 2390.

The linearity setting unit 2385 sets, in the clock generation apparatus 2301, the adjustment data decided through linearity adjustment by the linearity adjustment unit 2365. The compensation function setting unit 2390 sets, in the clock generation apparatus 2301, the adjustment data for temperature compensation decided by the compensation function decision unit 2370.

Figure 24:
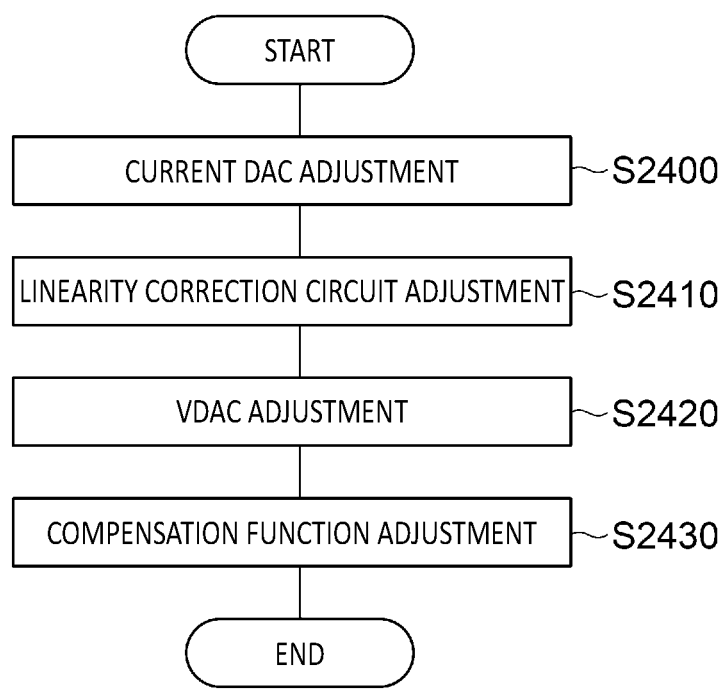
FIG. 24 shows an adjustment flow of a clock generation apparatus 2301 by the adjustment apparatus 2310 according to the present embodiment.

FIG. 24 shows an adjustment flow of the clock generation apparatus 2301 by the adjustment apparatus 2310 according to the present embodiment. In S2400 (step 2400), the adjustment apparatus 2310 adjusts linearity of a current DAC such as the current DAC 354 included in the second VCO 332 in the clock generation apparatus 2301.

In S2410, the adjustment apparatus 2310 adjusts linearity of a linearity correction circuit such as the linearity correction circuit 1140 included in the digital temperature compensation circuit 1135 in the clock generation apparatus 2301. In S2420, the adjustment apparatus 2310 adjusts linearity of a VDAC such as the VDAC 140 in the clock generation apparatus 2301. In S2430, the adjustment apparatus 2310 adjusts a compensation function of the polynomial circuit 1342, the polynomial circuit 1442, the polynomial circuit 1842, or the like in the clock generation apparatus 2301.

Figure 25:
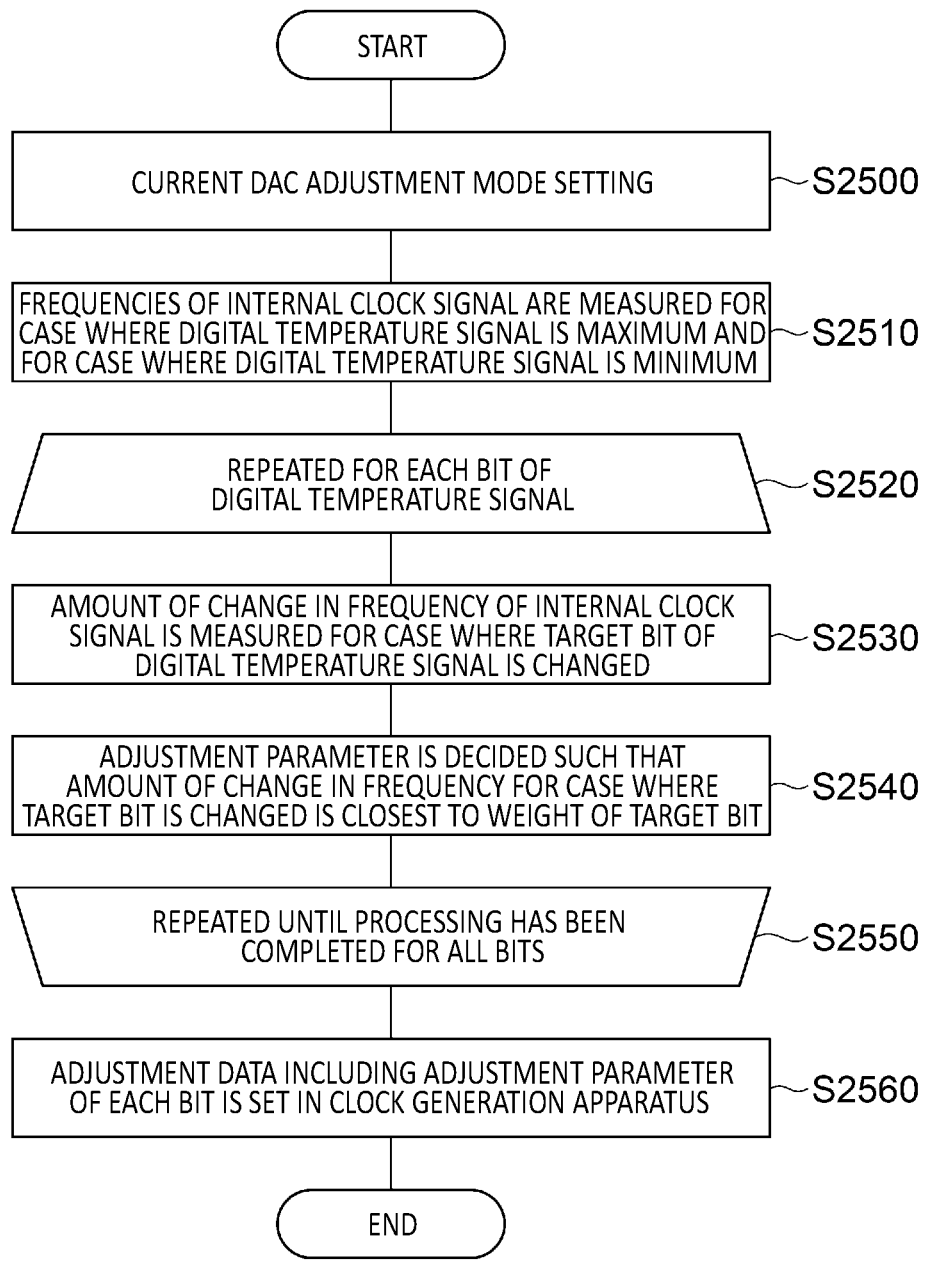
FIG. 25 shows a current DAC adjustment flow of the clock generation apparatus 2301 by the adjustment apparatus 2310 according to the present embodiment.

FIG. 25 shows a current DAC adjustment flow of the clock generation apparatus 2301 by the adjustment apparatus 2310 according to the present embodiment. The current DAC adjustment flow shown in the present figure may be performed in S2400 of FIG. 24. The adjustment apparatus 2310 adjust a current DAC in the second VCO 232, such as the current DAC 354 included in the second VCO 332 in the clock generation apparatus 2301, in the current DAC adjustment flow shown in the present figure. A case where the adjustment apparatus 2310 adjusts the current DAC 354 will be exemplified below. Note that the current DAC adjustment flow shown in the present figure exemplifies a case where the current DAC 354 is configured to allow a current weighted by $2^i$ to flow for each bit i (i=0, 1, . . . , I−1) of an I-bit digital temperature signal.

In S2500, the mode setting unit 2330 in the adjustment apparatus 2310 sets the clock generation apparatus 2301 to a current DAC adjustment mode. The clock generation apparatus 2301 allows reading and writing of an adjustment parameter of the current DAC 354 according to an instruction from the adjustment apparatus 2310 in the current DAC adjustment mode. The clock generation apparatus 2301 is set to input, to the current DAC 354 in the second VCO 332, a digital temperature signal (or feedback signal) inputted by the signal supply unit 2335 to the clock generation apparatus 2301 instead of a digital temperature signal (or feedback signal) according to a phase difference signal from the phase comparator 234, in the current DAC adjustment mode. In addition, the clock generation apparatus 2301 is set to output, to an outside of the clock generation apparatus 2301, an internal clock signal outputted by the second VCO 332, in the current DAC adjustment mode.

In addition, the clock generation apparatus 2301 may be set to force an analog temperature signal to a fixed value (for example, 1V), in the current DAC adjustment mode. Alternatively, the temperature setting unit 2325 in the adjustment apparatus 2310 may instruct the temperature control apparatus 2305 to bring temperature of the clock generation apparatus 2301 to a predetermined fixed temperature.

In S2510, the signal supply unit 2335 inputs the digital temperature signal of a minimum value (for example, 0) and a maximum value (for example, maximum code value $H=2^I-1$) to the clock generation apparatus 2301. The frequency measurement unit 2350 measures a frequency $F_0$ of the internal clock signal for a case where the digital temperature signal is minimum and a frequency $F_H$ of the internal clock signal for a case where the digital temperature signal is maximum.

The adjustment apparatus 2310 repeats processing from S2520 to S2550 for each bit of the digital temperature signal. For example, the adjustment apparatus 2310 repeats the processing from S2520 to S2550 for each bit i from the least significant bit to the most significant bit of the digital temperature signal.

The signal supply unit 2335 changes a target bit i of the digital temperature signal, and the frequency measurement unit 2350 measures an amount of change in frequency ΔF of the internal clock signal for a case where the target bit i is changed. For example, if the digital temperature signal is 10 bits and a target bit is a second bit (i=2), the signal supply unit 2335 sets the digital temperature signal to 10'b0000000000 and 10'b0000000100, and the frequency measurement unit 2350 measures a frequency of the internal clock signal for a case where the digital temperature signal is 10'b0000000000 and a frequency of the internal clock signal for a case where the digital temperature signal is 10'b0000000100, to use a difference between these frequencies as the amount of change in frequency ΔF. Note that a plurality of remaining bits other than the target bit i only need to have the same pattern in measurement of the frequencies for a case where the target bit i is 0 and a case where the target bit i is 1, and do not necessarily have to be all 0 or all 1.

In S2540, the linearity adjustment unit 2365 decides the adjustment parameter for the target bit i of the current DAC 354 such that the amount of change in frequency ΔF is the closest to weight of the target bit i. Since an ideal value $\Delta F_{ideal}$ of the amount of change in frequency ΔF with the target bit i is $(F_H-F_0)\times(2^i/2^I)$, the linearity adjustment unit 2365 decides the adjustment parameter for weight of a target bit k such that the amount of change in frequency ΔF is brought closer to the ideal value $\Delta F_{ideal}$, such as by calculating the adjustment parameter obtained by multiplying a current weight of the target bit i by $\Delta F_{ideal}/\Delta F$.

The adjustment apparatus 2310 repeats the processing from S2520 to S2550 until processing has been completed for all bits of the digital temperature signal. After the repetitive processing is completed, in S2560, the linearity setting unit 2385 writes adjustment data including the adjustment parameter for weight of each bit to the adjustment data storage unit 150, thereby setting it in the clock generation apparatus 2301.

Note that various other methods may be adopted as a method of deciding the adjustment parameter for each target bit i. For example, the signal supply unit 2335 may adjust the weight of the target bit i such that the amount of change in frequency ΔF for the time when the digital temperature signal (for example, 10'b0000000100) in which only the target bit i is 1 and the other bits are 0 and the digital temperature signal obtained by subtracting 1 from this value (for example, 10'b0000000011) are inputted to the clock generation apparatus 2301 is an ideal amount of change in frequency for the time when the digital temperature signal changes by 1.

Figure 26:
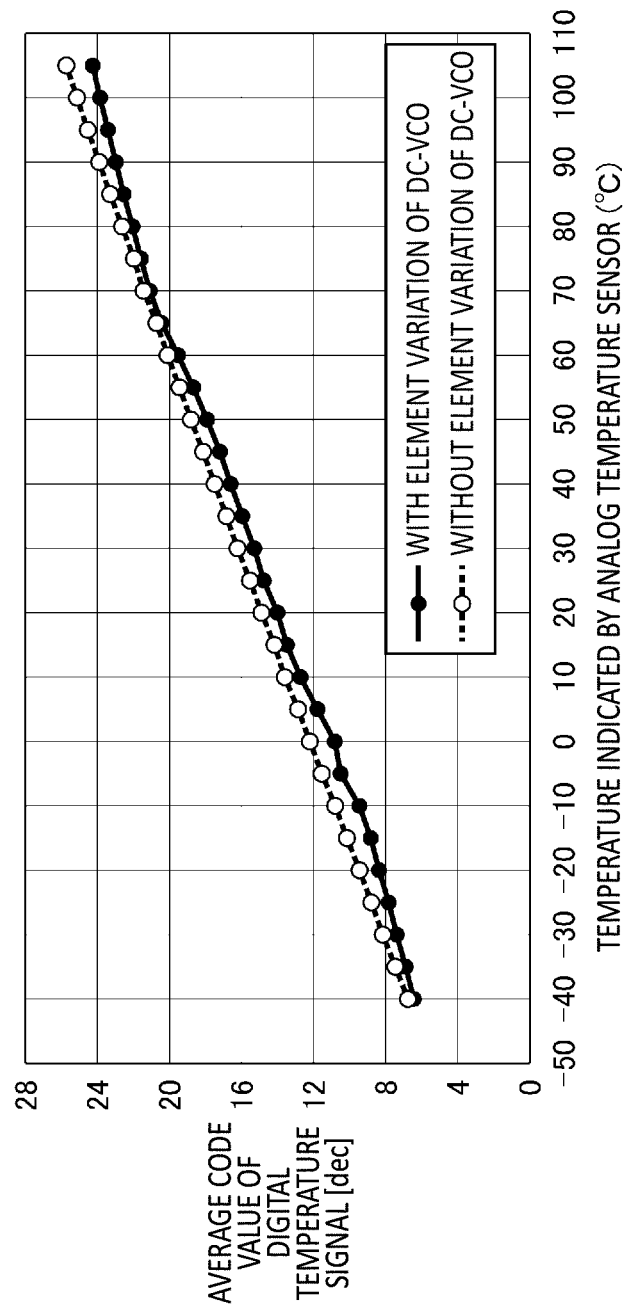
FIG. 26 shows an example of linearity of digital temperature signals.

FIG. 26 shows an example of linearity of digital temperature signals. The horizontal axis of the present figure represents temperature indicated by an analog temperature signal from the temperature sensor 125, and the vertical axis represents an average code value of the digital temperature signal. A solid-line graph labeled "with element variation of DC-VCO" indicates a state in which weight of each bit of the current DAC 354 in the second VCO 332 varies and the linearity of the digital temperature signal with respect to the temperature is low.

If the linearity of the digital temperature signal with respect to the temperature is low, the digital temperature signal cannot be represented by a linear function of the temperature, and will include a component of a second or higher order of the temperature. In this case, when the polynomial circuit 1342, the polynomial circuit 1442, the polynomial circuit 1842, or another polynomial circuit 1142 calculates a digital temperature compensation signal by using an N-th order polynomial, a higher-order component of an (N+1)-th or higher order of the temperature is mixed into the digital temperature compensation signal, and a frequency error is generated in temperature compensation by the digital temperature compensation signal.

A dashed-line graph labeled "without element variation of DC-VCO" of the present figure indicates a state in which the digital temperature signal has high linearity with respect to the temperature as a result of adjusting the weight of each bit of the current DAC 354 in the second VCO 332. The adjustment apparatus 2310 can adjust each adjustment parameter of the current DAC 354, thereby reducing generation of the frequency error involved with the higher-order component of the (N+1)-th or higher order being mixed into the digital temperature compensation signal.

Figure 27:
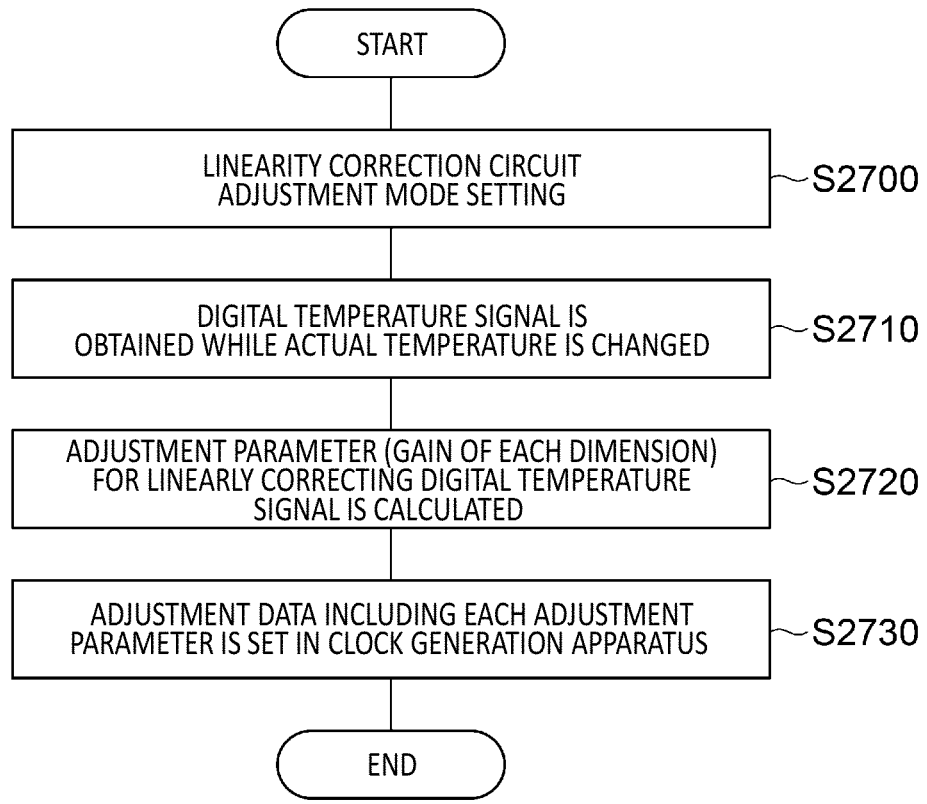
FIG. 27 shows a linearity correction circuit adjustment flow of the clock generation apparatus 2301 by the adjustment apparatus 2310 according to the present embodiment.

FIG. 27 shows a linearity correction circuit adjustment flow of the clock generation apparatus 2301 by the adjustment apparatus 2310 according to the present embodiment. The linearity correction circuit adjustment flow shown in the present figure may be performed in S2410 of FIG. 24. Adjustment according to the current DAC adjustment flow shown in FIG. 25 adjusts linearity of a frequency of an internal clock signal with respect to a digital temperature signal. In contrast, the linearity correction circuit adjustment flow in the present figure adjusts the linearity of the digital temperature signal with respect to temperature. In the linearity correction circuit adjustment flow shown in the present figure, the adjustment apparatus 2310 adjusts the linearity correction circuit 1140 included in the digital temperature compensation circuit 1135, such as the linearity correction circuit 1240 in the clock generation apparatus 2301. A case where the adjustment apparatus 2310 adjusts the linearity correction circuit 1240 will be exemplified below.

In S2700, the mode setting unit 2330 in the adjustment apparatus 2310 sets the clock generation apparatus 2301 to a linearity correction circuit adjustment mode. The clock generation apparatus 2301 allows reading and writing of an adjustment parameter of the linearity correction circuit 1240 according to an instruction from the adjustment apparatus 2310 in the linearity correction circuit adjustment mode. The clock generation apparatus 2301 is set to output, to an outside of the clock generation apparatus 2301, the digital temperature signal outputted by the TADC 230, in the linearity correction circuit adjustment mode.

In S2710, the temperature setting unit 2325 controls the temperature control apparatus 2305, to set actual temperature of the clock generation apparatus 2301 to various temperatures within a temperature compensation range. The digital input unit 2345 obtains, from the clock generation apparatus 2301, the digital temperature signal outputted by the linearity correction circuit 1240 in the clock generation apparatus 2301 at each actual temperature.

In S2720, the linearity adjustment unit 2365 calculates each adjustment parameter of the linearity correction circuit 1240 for linearly correcting the digital temperature signal, by using a value of the digital temperature signal at each actual temperature. For example, the linearity adjustment unit 2365 may calculate, by using a least squares method or the like, an approximate curve (if a correction function is a cubic polynomial, an approximate function of a cubic function) for converting each value of the digital temperature signal outputted by the TADC 230 to a value indicating corresponding actual temperature, to use a gain $P_1$, $P_2$, $P_3$, or the like of each dimension in the approximate curve as the adjustment parameter. In S2730, the linearity setting unit 2385 writes adjustment data including each calculated adjustment parameter to the adjustment data storage unit 150, thereby setting it in the linearity correction circuit 1240 in the clock generation apparatus 2301.

Figure 28A:
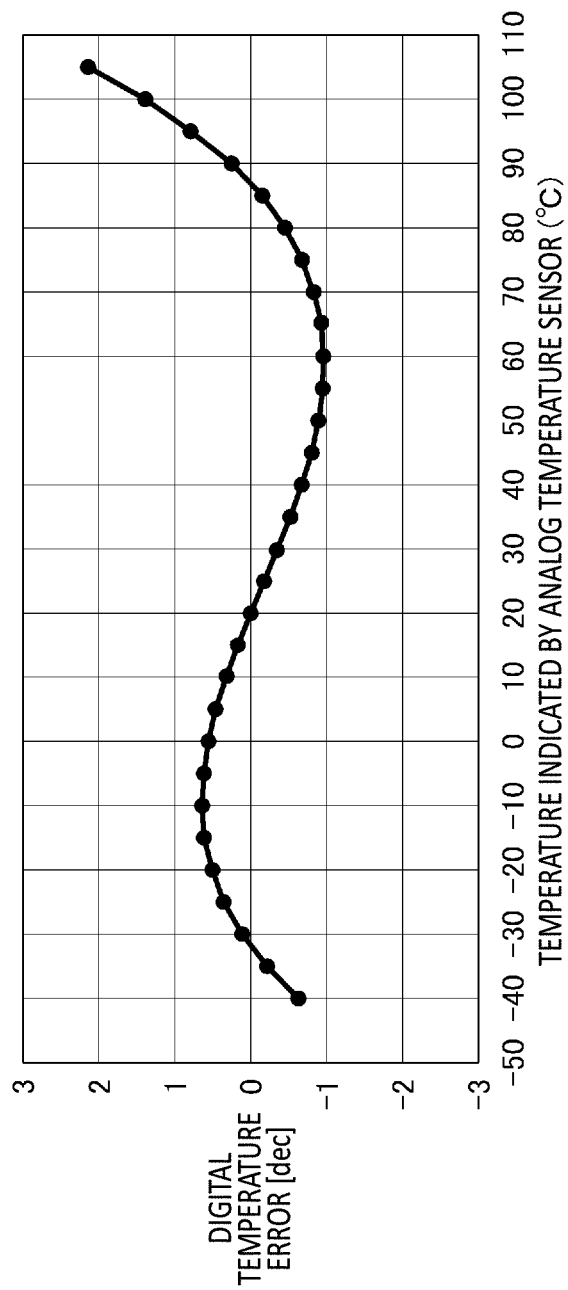
FIG. 28A shows an example of a frequency error characteristic of a digital temperature signal.

FIG. 28A shows an example of a frequency error characteristic of a digital temperature signal.

Figure 28B:
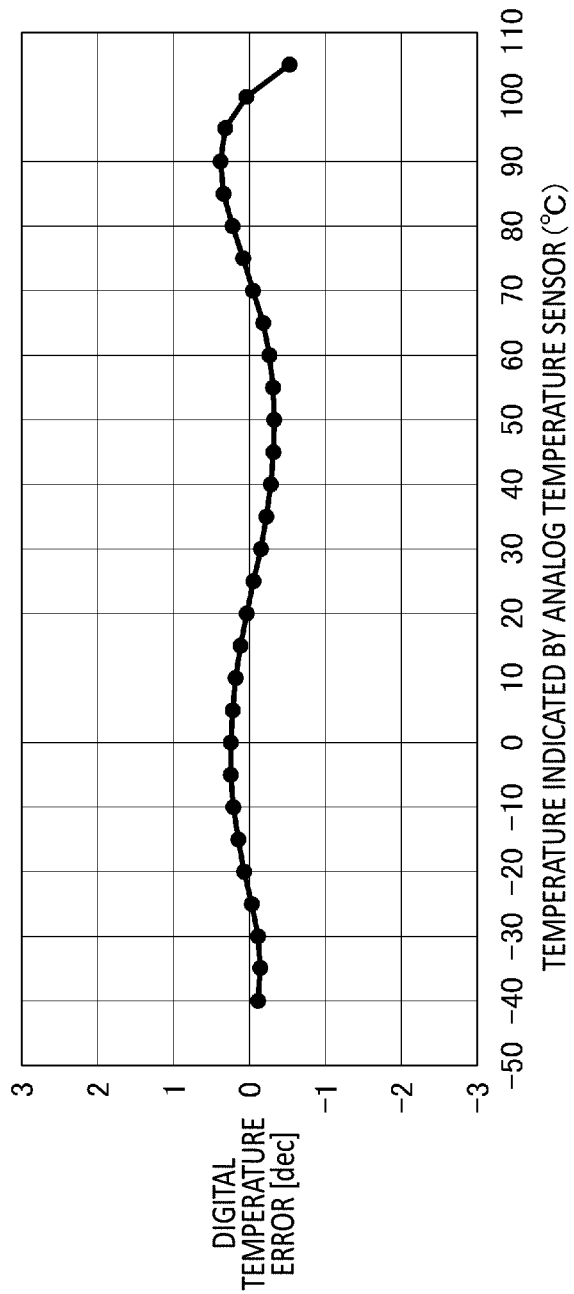
FIG. 28B shows an example of a frequency error characteristic of a digital temperature signal after linearity correction.

FIG. 28B shows an example of a frequency error characteristic of a digital temperature signal after linearity correction of the linearity correction circuit 1140. The horizontal axes in these figures represent temperature indicated by an analog temperature signal from the temperature sensor 125, and the vertical axes represent an error of the digital temperature signal (average) with respect to the temperature indicated by the analog temperature signal.

As described with reference to FIG. 26, if the digital temperature signal does not have linearity with respect to the temperature, a higher-order component of an (N+1)-th or higher order of the temperature is mixed into the digital temperature compensation signal, and a frequency error is generated in temperature compensation by the digital temperature compensation signal. The adjustment apparatus 2310 can adjust the linearity correction circuit 1140, thereby increasing the linearity of the digital temperature signal with respect to the temperature and reducing the frequency error of an output clock signal after the temperature compensation. Note that the clock generation apparatus 1 and the adjustment apparatus 2310 may be able to perform only either the adjustment in FIG. 25 or the adjustment in FIG. 27.

Figure 29:
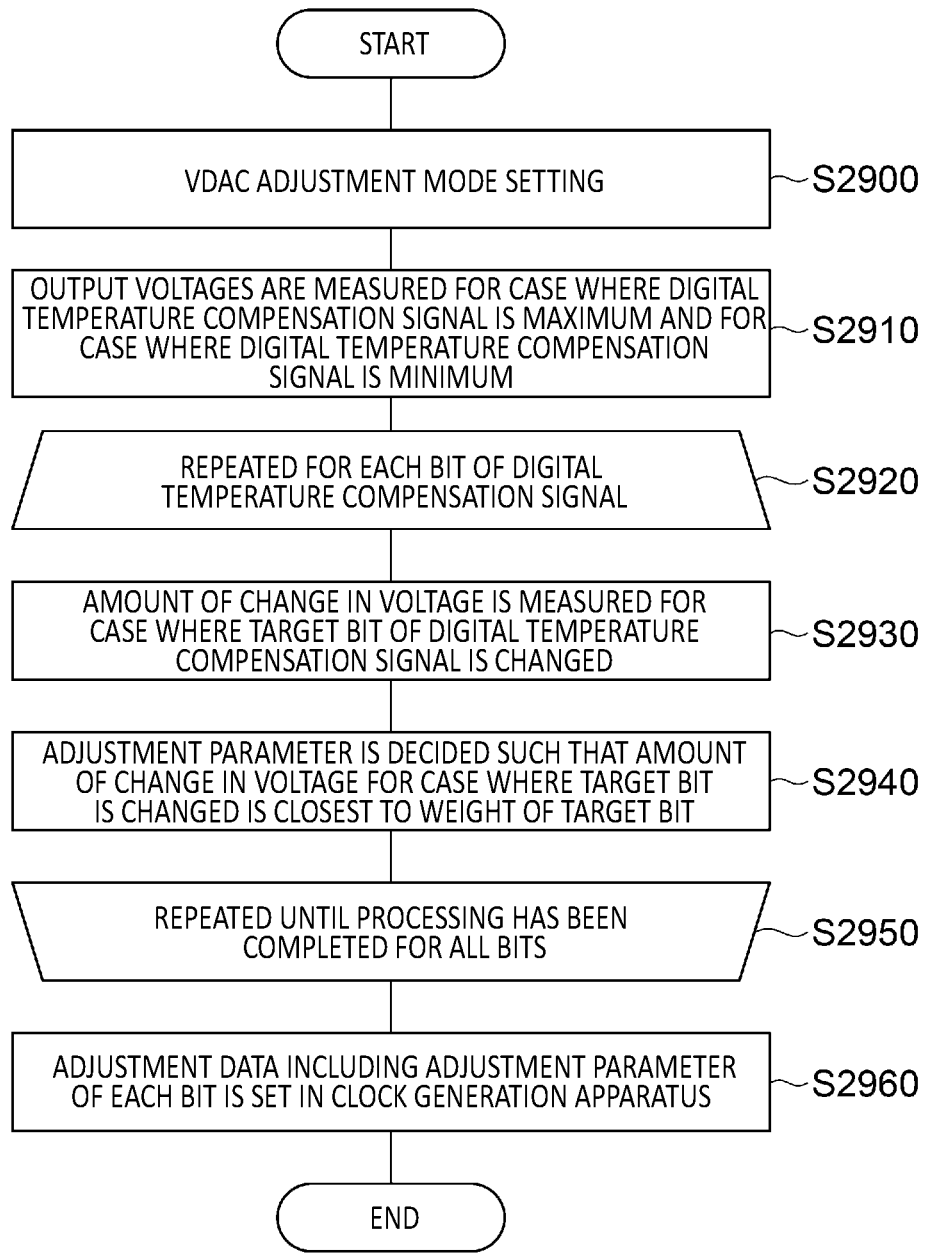
FIG. 29 shows a VDAC adjustment flow of the clock generation apparatus 2301 by the adjustment apparatus 2310 according to the present embodiment.

FIG. 29 shows a VDAC adjustment flow of the clock generation apparatus 2301 by the adjustment apparatus 2310 according to the present embodiment. The VDAC adjustment flow shown in the present figure may be performed in S2420 of FIG. 24. The adjustment apparatus 2310 adjusts a voltage DAC such as the VDAC 140 in the clock generation apparatus 2301, in the VDAC adjustment flow shown in the present figure. A case where the adjustment apparatus 2310 adjusts the VDAC 140 will be exemplified below. Note that the VDAC adjustment flow shown in the present figure exemplifies a case where the VDAC 140 is configured to output a voltage weighted by $2^p$, for each bit p (p=0, 1, . . . , P−1) of a P-bit digital temperature compensation signal.

In S2900, the mode setting unit 2330 in the adjustment apparatus 2310 sets the clock generation apparatus 2301 to a VDAC adjustment mode. The clock generation apparatus 2301 allows reading and writing of an adjustment parameter of the VDAC 140 according to an instruction from the adjustment apparatus 2310 in the VDAC adjustment mode. The clock generation apparatus 2301 is set to input, to the VDAC 140, a digital temperature compensation signal inputted by the signal supply unit 2335 to the clock generation apparatus 2301 instead of a digital temperature compensation signal from the digital temperature compensation circuit 135, in the VDAC adjustment mode. In addition, the clock generation apparatus 2301 is set to output, to an outside of the clock generation apparatus 2301, an analog temperature compensation signal outputted by the VDAC 140, in the VDAC adjustment mode. In addition, the clock generation apparatus 2301 may cut off connection between the analog temperature compensation circuit 160 and the LPF 145 in the VDAC adjustment mode.

In S2910, the signal supply unit 2335 inputs the digital temperature compensation signal of a minimum value (for example, 0) and a maximum value (for example, maximum code value Q=$2^p$−1) to the clock generation apparatus 2301. The voltage measurement unit 2355 measures a voltage $V_O$ of the analog temperature compensation signal outputted by the VDAC 140 if the digital temperature compensation signal is the minimum value and a voltage $V_Q$ of the analog temperature compensation signal outputted by the VDAC 140 if the digital temperature compensation signal is the maximum value.

The adjustment apparatus 2310 repeats processing from S2920 to S2950 for each bit of the digital temperature compensation signal. For example, the adjustment apparatus 2310 repeats the processing from S2920 to S2950 for each bit p from the least significant bit to the most significant bit of the digital temperature compensation signal.

In S2930, the voltage measurement unit 2355 measures an amount of change in voltage ΔV of the digital temperature compensation signal for a case where a target bit p of the digital temperature compensation signal is changed. For example, if the digital temperature signal is 5 bits and a target bit is a second bit (p=2), the signal supply unit 2335 sets the digital temperature compensation signal to 5'b00000 and 5'b00100, and the voltage measurement unit 2355 measures a voltage of the analog temperature compensation signal for a case where the digital temperature compensation signal is 5'b00000 and a voltage of the analog temperature compensation signal for a case where the digital temperature compensation signal is 5'b00100, to use a difference between these voltages as the amount of change in voltage ΔV. Note that a plurality of remaining bits other than the target bit p only need to have the same pattern in measurement of the frequencies for a case where the target bit p is 0 and a case where the target bit i is 1, and do not necessarily have to be all 0 or all 1.

In S2940, the linearity adjustment unit 2365 decides the adjustment parameter for the target bit p of the current DAC 354 such that the amount of change in voltage ΔV is the closest to weight of the target bit p. Since an ideal value $\Delta V_{ideal}$ of the amount of change in voltage ΔV of the target bit p is $(V_Q - V_O) \times (2^p/2^P)$, the linearity adjustment unit 2365 decides the adjustment parameter for the weight of the target bit p such that the amount of change in voltage ΔV is brought closer to the ideal value $\Delta V_{ideal}$, such as by calculating the adjustment parameter obtained by multiplying a current weight of the target bit p by $\Delta V_{ideal}/\Delta V$.

The adjustment apparatus 2310 repeats the processing from S2920 to S2950 until processing has been completed for all bits of the digital temperature compensation signal. After the repetitive processing is completed, in S2960, the linearity setting unit 2385 writes adjustment data including the adjustment parameter for weight of each bit to the adjustment data storage unit 150, thereby setting it in the clock generation apparatus 2301.

The adjustment apparatus 2310 can reduce an error of a control voltage supplied to the first VCO 120 according to the digital temperature compensation signal outputted by the digital temperature compensation circuit 135, by adjusting linearity of the voltage DAC such as the VDAC 140. As a result, the adjustment apparatus 2310 can reduce a frequency error of an output clock signal after temperature compensation.

Figure 30:
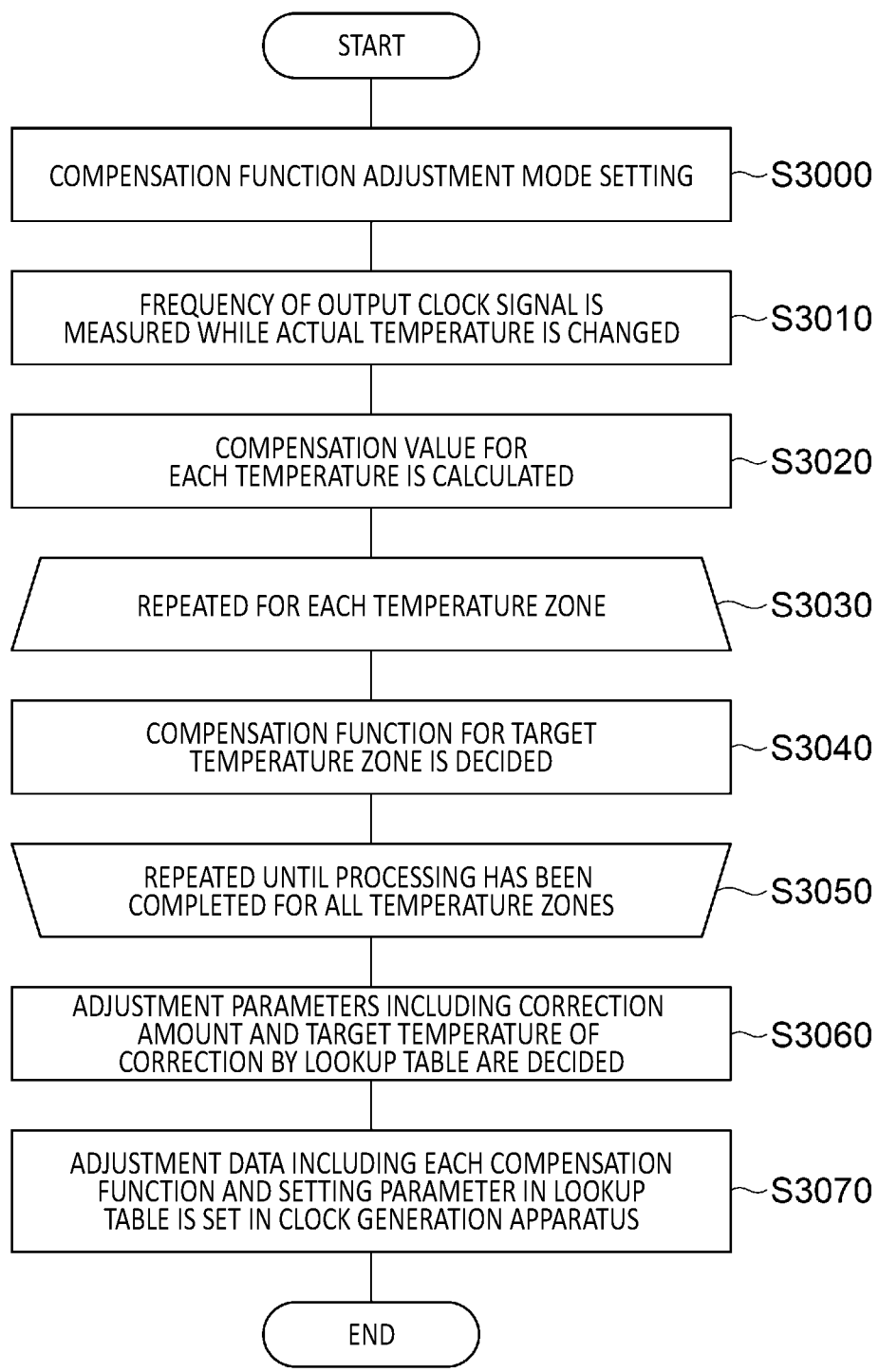
FIG. 30 shows a compensation function adjustment flow of the clock generation apparatus 2301 by the adjustment apparatus 2310 according to the present embodiment.

FIG. 30 shows a compensation function adjustment flow of the clock generation apparatus 2301 by the adjustment apparatus 2310 according to the present embodiment. The compensation function adjustment flow shown in the present figure may be performed in S2430 of FIG. 24.

In S3000, the mode setting unit 2330 in the adjustment apparatus 2310 sets the clock generation apparatus 2301 to a compensation function adjustment mode. The clock generation apparatus 2301 may allow reading and writing of an adjustment parameter related to a compensation function according to an instruction from the adjustment apparatus 2310 in the compensation function adjustment mode.

In S3010, the temperature setting unit 2325 controls the temperature control apparatus 2305, to set actual temperature of the clock generation apparatus 2301 to various temperatures within a temperature compensation range. The frequency measurement unit 2350 measures a frequency of an output clock signal outputted by the clock generation apparatus 2301 at each actual temperature.

In S3020, the compensation function decision unit 2370 calculates a value of a digital temperature compensation signal (a compensation value) for compensating an error of the frequency of the output clock signal at each actual temperature (a difference from a target frequency independent of temperature). The compensation function decision unit 2370 may store in advance a frequency increment (design value or measurement value) of the output clock signal for each time the digital temperature compensation signal increases by a unit amount (for example, +1), and decide an amount by which the digital temperature compensation signal should be increased or decreased in order to compensate a frequency error at each actual temperature. Alternatively, the compensation function decision unit 2370 may adjust an offset value to be added to the digital temperature compensation signal such that the frequency of the output clock signal is the target frequency at each actual temperature, and decide this offset value as an amount to be added to the digital temperature compensation signal at each actual temperature. As a result, the compensation function decision unit 2370 can obtain an ideal value of the digital temperature compensation signal at each actual temperature.

The adjustment apparatus 2310 repeats processing from S3030 to S3050 for each temperature zone. In S3040, the compensation function decision unit 2370 decides the compensation function for each of a plurality of temperature zones. For each temperature zone, the compensation function decision unit 2370 may calculate, by using a least squares method or the like, an approximate curve (if the compensation function is a quintic polynomial, an approximate function of a quintic function) for converting a digital temperature signal indicating each actual temperature to a value as close as possible to the ideal value of the digital temperature compensation signal at each actual temperature, to use a gain $G_1, G_2, \ldots, G_N$, or the like of each dimension in the approximate curve as the adjustment parameter of the compensation function.

When the processing from S3030 to S3050 has been completed for all temperature zones, the compensation function decision unit 2370 decides, in S3060, adjustment parameters including a frequency correction amount and target temperature of correction by the lookup table 1850 for temperature of a boundary portion between the temperature zones. The compensation function decision unit 2370 may use, as a target of the correction by the lookup table 1850, a point where the value of the digital temperature compensation signal by the compensation function has an error equal to or greater than a threshold from the ideal value, within a predetermined temperature range (for example, ±2 degrees C.) from the boundary between the temperature zones. In S3070, the compensation function setting unit 2390 writes, to the adjustment data storage unit 150, adjustment data including the compensation function corresponding to each of the plurality of temperature zones and each setting parameter to be set in the lookup table 1850, thereby setting it in the clock generation apparatus 2301.

Figure 31:
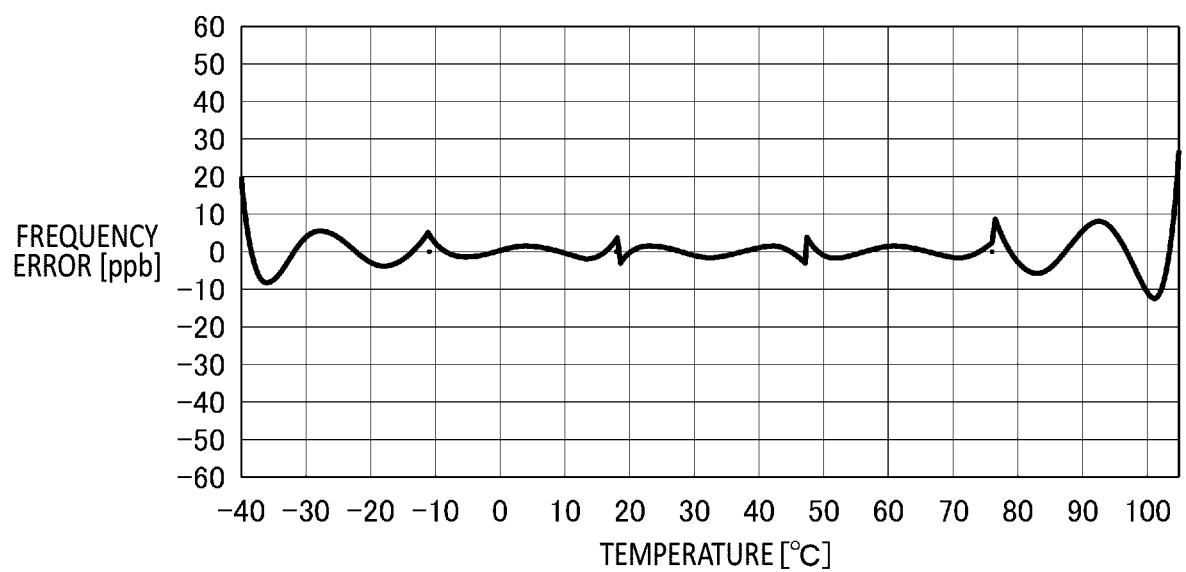
FIG. 31 shows an example of a frequency error characteristic after digital temperature compensation.

FIG. 31 shows an example of a frequency error characteristic after digital temperature compensation. The horizontal axis of the present figure represents temperature, and the vertical axis represents a frequency error (ppb) of an output clock signal. The frequency error characteristic in the present figure indicates, for each of the five temperature zones shown in FIG. 15, the frequency error of the output clock signal for a case where a compensation function generated by using an ideal value of a digital temperature compensation signal in the temperature zone is used.

Figure 32A:
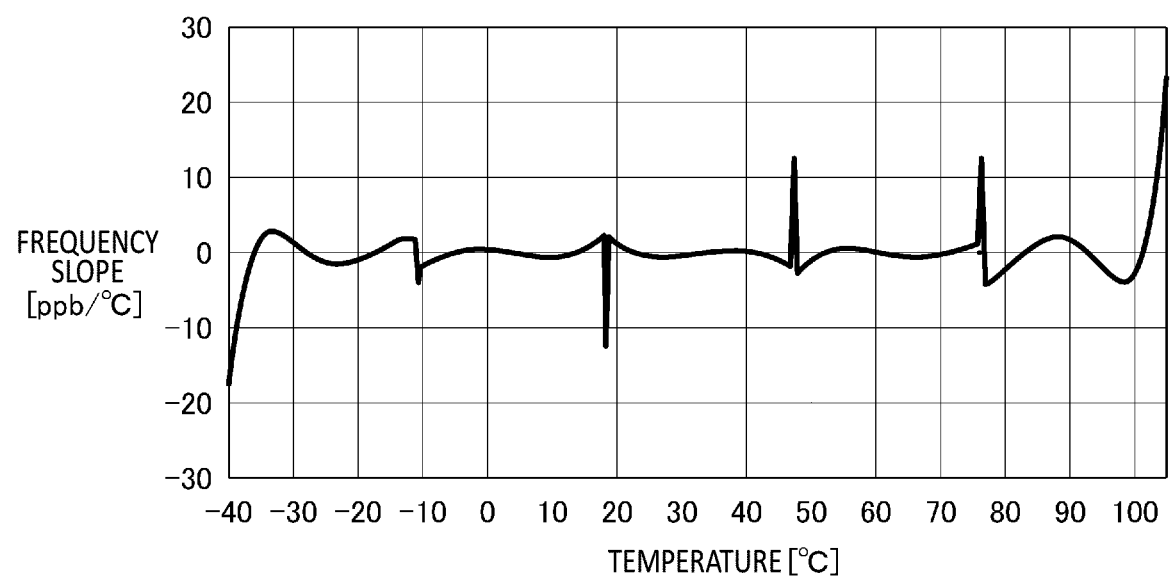
FIG. 32A shows an example of a frequency temperature slope after digital temperature compensation.

FIG. 32A shows an example of a frequency temperature slope after digital temperature compensation. The horizontal axis of the present figure represents temperature, and the vertical axis represents a frequency temperature slope of an output clock signal. The frequency temperature slope shown in the present figure indicates a gradient between two adjacent temperature points (an amount of change in a frequency error per 1 degree C. of temperature) in FIG. 31, and corresponds to differentiation of a frequency error characteristic in FIG. 31. As shown in FIG. 32A, when a compensation function is generated, for each temperature zone, by using an ideal value of a digital temperature compensation signal in the temperature zone, compensation functions of adjacent temperature zones become discontinuous, which may result in an absolute value of the frequency temperature slope increasing at a boundary portion between the temperature zones. The frequency temperature slope indicates an amount of change in frequency for a case where ambient temperature suddenly changes, and is desired to be gentle.

Figure 32B:
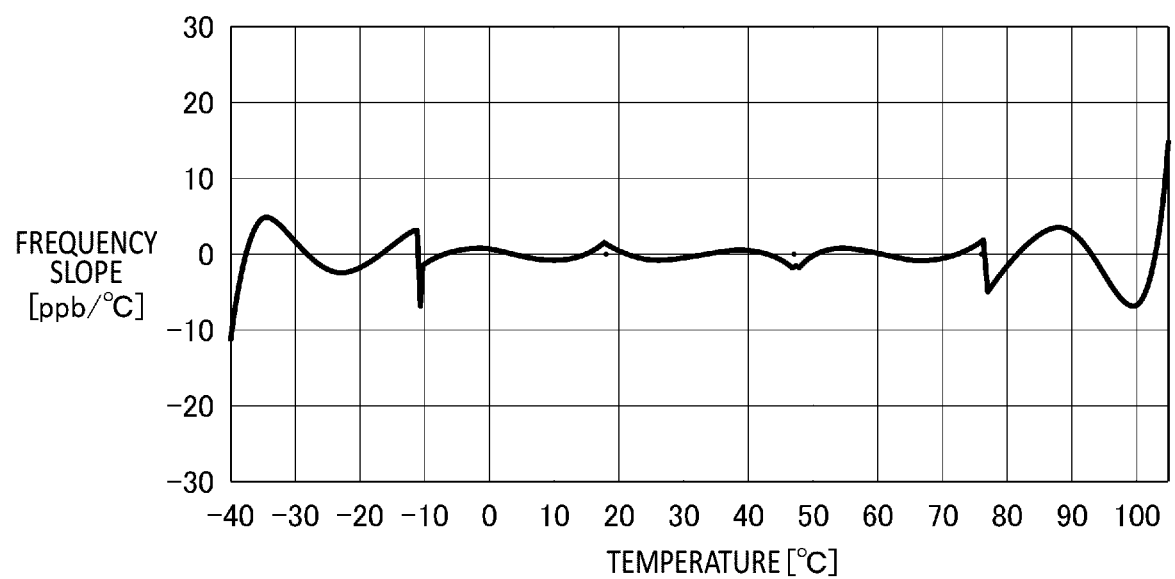
FIG. 32B shows an example of a frequency temperature slope after digital temperature compensation for a case where a compensation function is decided by overlapping each zone.

FIG. 32B shows an example of a frequency temperature slope after digital temperature compensation for a case where a compensation function is decided by overlapping each zone. The horizontal axis of the present figure represents temperature, and the vertical axis represents a frequency temperature slope of an output clock signal.

In the example of the present figure, the compensation function decision unit 2370 decides, for each of a plurality of temperature zones, the compensation function by using a zone defined to partially overlap with an adjacent temperature zone. Specifically, in the example of the present figure, for each temperature zone, the compensation function decision unit 2370 extends a boundary of the temperature zone by ±2 degrees C. (extends a lower limit of the temperature zone by −2 degrees C., and extends an upper limit of the temperature zone by +2 degrees C.), and generates the compensation function by using an ideal value of a digital temperature compensation signal included in the extended zone. For the temperature zone 3 from +18 degrees C. to +47 degrees C. for example, the compensation function decision unit 2370 generates the compensation function ranging from +16 degrees C. to +49 degrees C. by using an ideal value of a digital temperature signal included in the zone from +16 degrees C. to +49 degrees C., so that the generated compensation function is used in a temperature range from +18 degrees C. to +47 degrees C.

The adjustment apparatus 2310 can decide, for each temperature zone, the compensation function by using the zone partially overlapping with the adjacent temperature zone, thereby reducing an absolute value of the frequency temperature slope at the boundary of the temperature zone, as shown in in FIG. 32B. As a result, the adjustment apparatus 2310 can reduce discontinuity generated in a frequency error characteristic of the output clock signal at the boundary of the temperature zone.

Various embodiments of the present invention may be described with reference to flowcharts and block diagrams whose blocks may represent (1) stages of processes in which operations are performed or (2) sections of apparatuses responsible for performing operations. Certain stages and sections may be implemented by dedicated circuit, programmable circuit supplied with computer readable instructions stored on computer readable media, and/or processors supplied with computer readable instructions stored on computer readable media. Dedicated circuit may include digital and/or analog hardware circuits, and may include integrated circuits (IC) and/or discrete circuits. The programmable circuit may include a reconfigurable hardware circuit including logical AND, logical OR, logical XOR, logical NAND, logical NOR, and other logical operations, a memory element such as a flip-flop, a register, a field programmable gate array (FPGA) and a programmable logic array (PLA), and the like.

A computer readable medium may include any tangible device that can store instructions to be executed by a suitable device, and as a result, the computer readable medium having instructions stored thereon includes an article of manufacture including instructions which can be executed in order to create means for performing operations designated in the flowcharts or block diagrams. Examples of the computer readable medium may include an electronic storage medium, a magnetic storage medium, an optical storage medium, an electromagnetic storage medium, a semiconductor storage medium, and the like. More specific examples of the computer readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a fuse, a static random access memory (SRAM), a compact disc read-only memory (CD-ROM), a digital versatile disk (DVD), a Blu-ray (registered trademark) disk, a memory stick, an integrated circuit card, and the like.

The computer readable instruction may include: an assembler instruction, an instruction-set-architecture (ISA) instruction; a machine instruction; a machine dependent instruction; a microcode; a firmware instruction; state-setting data; or either a source code or an object code described in any combination of one or more programming languages, including an object oriented programming language such as Smalltalk (registered trademark), JAVA (registered trademark), C++, Python, or the like; and a conventional procedural programming language such as a "C" programming language or a similar programming language.

The computer readable instructions may be provided for a processor or programmable circuit of a general purpose computer, special purpose computer, or other programmable data processing apparatuses such as a computer locally or via a wide area network (WAN) such as a local area network (LAN), the Internet, or the like, and execute the computer readable instructions in order to create means for executing the operations designated in flowcharts or block diagrams. Examples of the processor include a computer processor, a processing unit, a microprocessor, a digital signal processor, a controller, a microcontroller, and the like.

Figure 33:
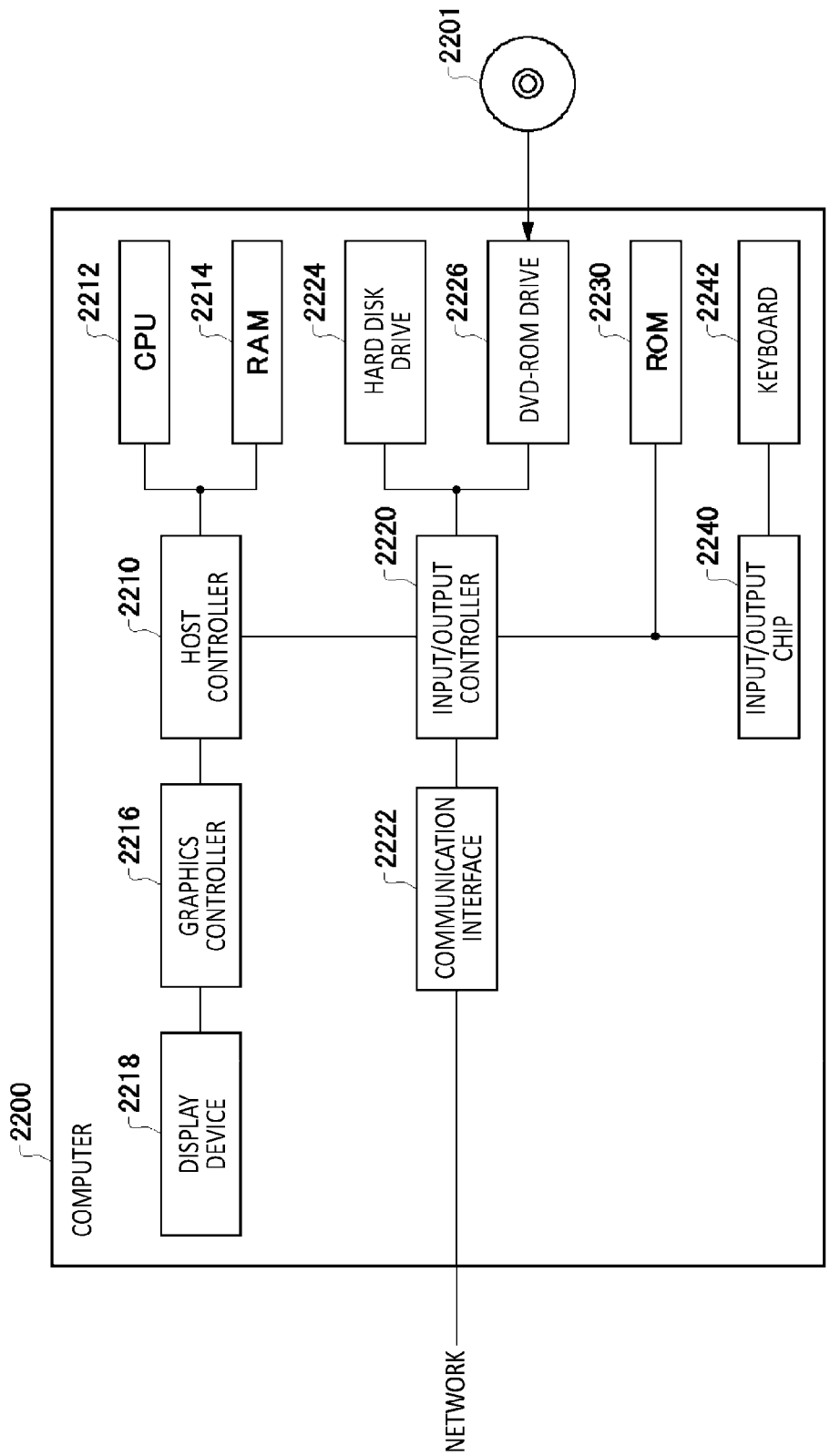
FIG. 33 shows an example of a computer 2200 in which a plurality of aspects of the present invention may be entirely or partially embodied.

FIG. 33 shows an example of a computer 2200 in which a plurality of aspects of the present invention may be entirely or partially embodied. A program installed in the computer 2200 may cause the computer 2200 to function as an operation associated with the apparatuses according to the embodiments of the present invention or as one or more sections of the apparatuses, or may cause the operation or the one or more sections to be executed, and/or may cause the computer 2200 to execute a process according to the embodiments of the present invention or a stage of the process. Such programs may be executed by a CPU 2212 in order to cause the computer 2200 to perform certain operations associated with some or all of the blocks in the flowcharts and block diagrams described in the present specification.

The computer 2200 according to the present embodiment includes the CPU 2212, a RAM 2214, a graphics controller 2216, and a display device 2218, which are mutually connected by a host controller 2210. The computer 2200 also includes input/output units such as a communication interface 2222, a hard disk drive 2224, a DVD-ROM drive 2226, and an IC card drive, which are connected to the host controller 2210 via an input/output controller 2220. The computer also includes legacy input/output units such as a ROM 2230 and a keyboard 2242, which are connected to the input/output controller 2220 via an input/output chip 2240.

The CPU 2212 operates according to programs stored in the ROM 2230 and the RAM 2214, thereby controlling each unit. The graphics controller 2216 obtains image data generated by the CPU 2212 on a frame buffer or the like provided in the RAM 2214 or in itself, and causes the image data to be displayed on the display device 2218.

The communication interface 2222 communicates with other electronic devices via a network. The hard disk drive 2224 stores programs and data used by the CPU 2212 in the computer 2200. The DVD-ROM drive 2226 reads the programs or the data from the DVD-ROM 2201, and provides the hard disk drive 2224 with the programs or the data via the RAM 2214. The IC card drive reads the programs and the data from the IC card, and/or writes the programs and the data to the IC card.

The ROM 2230 stores therein boot programs and the like executed by the computer 2200 at the time of activation, and/or programs that depend on the hardware of the computer 2200. The input/output chip 2240 may also connect various input/output units to the input/output controller 2220 via a parallel port, a serial port, a keyboard port, a mouse port, and the like.

The program is provided by a computer readable medium such as the DVD-ROM 2201 or the IC card. The program is read from a computer readable medium, installed in the hard disk drive 2224, the RAM 2214, or the ROM 2230 which are also examples of the computer readable medium, and executed by the CPU 2212. The information processing described in these programs is read by the computer 2200 and provides cooperation between the programs and the above-described various types of hardware resources. The apparatus or method may be configured by realizing operations or processing of information according to use of the computer 2200.

For example, in a case where communication is performed between the computer 2200 and an external device, the CPU 2212 may execute a communication program loaded in the RAM 2214 and instruct the communication interface 2222 to perform communication processing based on processing described in the communication program. Under the control of the CPU 2212, the communication interface 2222 reads transmission data stored in a transmission buffer processing region provided in a recording medium such as the RAM 2214, the hard disk drive 2224, the DVD-ROM 2201, or the IC card, transmits the read transmission data to the network, or writes reception data received from the network in a reception buffer processing region or the like provided on the recording medium.

In addition, the CPU 2212 may cause the RAM 2214 to read all or a necessary part of a file or database stored in an external recording medium such as the hard disk drive 2224, the DVD-ROM drive 2226 (DVD-ROM 2201), the IC card, or the like, and may execute various types of processing on data on the RAM 2214. Next, the CPU 2212 writes back the processed data to the external recording medium.

Various types of information such as various types of programs, data, tables, and databases may be stored in a recording medium and subjected to information processing. The CPU 2212 may execute various types of processing on the data read from the RAM 2214 to write back a result to the RAM 2214, the processing being described throughout the present disclosure, designated by instruction sequences of the programs, and including various types of operations, information processing, condition determinations, conditional branching, unconditional branching, information searches/replacements, or the like. In addition, the CPU 2212 may search for information in a file, a database, etc., in the recording medium. For example, when a plurality of entries, each having an attribute value of a first attribute associated with an attribute value of a second attribute, are stored in the recording medium, the CPU 2212 may search for an entry matching the condition whose attribute value of the first attribute is designated, from among the plurality of entries, and read the attribute value of the second attribute stored in the entry, thereby obtaining the attribute value of the second attribute associated with the first attribute satisfying the predetermined condition.

The programs or software modules described above may be stored in a computer readable medium on or near the computer 2200. In addition, a recording medium such as a hard disk or a RAM provided in a server system connected to a dedicated communication network or the Internet can be used as a computer readable medium, thereby providing a program to the computer 2200 via the network.

While the present invention has been described with the embodiments, the technical scope of the present invention is not limited to the scope described in the above-described embodiments. It is apparent to persons skilled in the art that diverse alterations or improvements can be made to the above-described embodiments. It is apparent from the description of the claims that embodiments added with such alterations or improvements can also be included in the technical scope of the present invention.

While the present invention has been described with the embodiments, the technical scope of the present invention is not limited to the scope described in the above-described embodiments. It is apparent to persons skilled in the art that diverse alterations or improvements can be made to the above-described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, embodiments, or diagrams can be realized in any order as long as the order is not indicated by "prior to," "before," or the like and as long as the output from a previous process is not used in a later process. Even if the operation flow is described using phrases such as "first" or "next" in the claims, embodiments, or diagrams for convenience, it does not necessarily mean that the process must be performed in this order.

EXPLANATION OF REFERENCES

1: clock generation apparatus, 100: oven, 105: resonator, 110: temperature sensor, 115: heater, 120: first VCO, 125: temperature sensor, 130: TADC, 135: digital temperature compensation circuit, 140: VDAC, 145: LPF, 150: adjustment data storage unit, 160: analog temperature compensation circuit, 170: oven control circuit, 175: resonator temperature detector, 180: target temperature signal generator, 190: differential amplifier, 195: heater driving circuit, 230: TADC, 232: second VCO, 234: phase comparator, 236: loop filter, 332: second VCO, 340: ring oscillator, 350: power supply current generator, 352: FET, 354: current DAC, 356: differential amplifier, 358: FET, 634: phase comparator, 640: binary converter, 834: phase comparator, 842: lock detection circuit, 844: frequency detection circuit, 846: counter, 848: counter, 850: frequency comparison circuit, 852: comparator, 854: amplifier, 856: comparator, 858: amplifier, 860: adder, 862: selection circuit, 936: loop filter, 940: amplifier, 942: delay element, 944: amplifier, 946: integrator, 948: adder, 1036: loop filter, 1135: digital temperature compensation circuit, 1140: linearity correction circuit, 1142: polynomial circuit, 1144: delta-sigma modulator, 1240: linearity correction circuit, 1250: exponentiator, 1252: amplifier, 1254: adder, 1342: polynomial circuit, 1350: exponentiator, 1352: amplifier, 1354: adder, 1442: polynomial circuit, 1450: temperature zone selection circuit, 1452: function generation circuit, 1454: temperature shift circuit, 1842: polynomial circuit, 1850: lookup table, 1852: storage region, 1854: correction amount selection circuit, 2030: TADC, 2038: delta-sigma modulator, 2130: TADC, 2140: dither application circuit, 2180: TADC, 2301: clock generation apparatus, 2305: temperature control apparatus, 2310: adjustment apparatus, 2320: condition setting unit, 2325: temperature setting unit, 2330: mode setting unit, 2335: signal supply unit, 2340: measurement unit, 2345: digital input unit, 2350: frequency measurement unit, 2355: voltage measurement unit, 2360: adjustment data decision unit, 2365: linearity adjustment unit, 2370: compensation function decision unit, 2380: adjustment data setting unit, 2385: linearity setting unit, 2390: compensation function setting unit, 2200: computer, 2201: DVD-ROM, 2210: host controller, 2212: CPU, 2214: RAM, 2216: graphics controller, 2218: display device, 2220: input/output controller, 2222:

communication interface, 2224: hard disk drive, 2226: DVD-ROM drive, 2230: ROM, 2240: input/output chip, 2242: keyboard.

What is claimed is:

1. A clock generation apparatus which generates an output clock signal, comprising:
   a first voltage-controlled oscillator which outputs the output clock signal;
   an AD converter which includes: a second voltage-controlled oscillator which outputs an internal clock signal phase-locked to the output clock signal in response to a digital temperature signal having become a value corresponding to an analog temperature signal from a temperature sensor; a phase comparator which detects a phase difference between the output clock signal and the internal clock signal; and a digital temperature signal generator which generates the digital temperature signal according to the phase difference detected by the phase comparator, to output it to the second voltage-controlled oscillator; and
   a digital temperature compensation circuit which compensates a frequency of the output clock signal of the first voltage-controlled oscillator by using the digital temperature signal;
   wherein
   the digital temperature compensation circuit compensates the frequency of the output clock signal by using a compensation function associated with each of a plurality of temperature zones into which a predetermined temperature range is divided, and
   the digital temperature compensation circuit controls the frequency of the output clock signal of the first voltage-controlled oscillator by using a temperature compensation value stored in a lookup table, in response to the digital temperature signal indicating temperature of a boundary portion between the temperature zones.

2. The clock generation apparatus according to claim 1, wherein
   the second voltage-controlled oscillator outputs the internal clock signal with a frequency according to the analog temperature signal and the phase difference detected by the phase comparator.

3. The clock generation apparatus according to claim 1, wherein the second voltage-controlled oscillator includes a ring oscillator which oscillates at a frequency according to a difference between temperature designated by the analog temperature signal and temperature designated by the digital temperature signal.

4. The clock generation apparatus according to claim 1, wherein
   the AD converter includes:
   a determination circuit which determines whether the phase difference detected by the phase comparator has come out of a predetermined range;
   a frequency detection circuit which detects frequencies of the output clock signal and the internal clock signal in response to the phase difference detected by the phase comparator having come out of the predetermined range; and
   a selection circuit which selects the phase difference detected by the phase comparator in response to the phase difference detected by the phase comparator falling within the predetermined range, and selects a phase difference decided according to a result of comparing a frequency equivalent to an integer multiple of the frequency of the output clock signal with the frequency of the internal clock signal in response to the phase difference detected by the phase comparator having come out of the predetermined range, and
   the second voltage-controlled oscillator outputs the internal clock signal with a frequency according to the analog temperature signal and the phase difference selected by the selection circuit.

5. The clock generation apparatus according to claim 1, wherein the AD converter includes a first delta-sigma modulator which modulates a signal which is based on a phase difference signal according to the phase difference between the output clock signal and the internal clock signal, to output it to the second voltage-controlled oscillator.

6. The clock generation apparatus according to claim 1, wherein the AD converter further includes a dither application circuit which applies dither to a signal which is based on a phase difference signal according to the phase difference between the output clock signal and the internal clock signal, to output the signal to the second voltage-controlled oscillator.

7. The clock generation apparatus according to claim 1, further comprising an analog temperature compensation circuit which compensates the frequency of the output clock signal of the first voltage-controlled oscillator according to the analog temperature signal, wherein
   the digital temperature compensation circuit compensates a frequency error of the output clock signal, which remains even after temperature compensation by the analog temperature compensation circuit.

8. The clock generation apparatus according to claim 1, wherein
   the digital temperature compensation circuit includes:
   a temperature zone selection circuit which selects a temperature zone to be used from among the plurality of temperature zones according to the digital temperature signal; and
   a function generation circuit which generates the compensation function which uses a parameter according to the temperature zone selected by the temperature zone selection circuit, and
   the digital temperature compensation circuit controls the frequency of the output clock signal of the first voltage-controlled oscillator by using the compensation function generated by the function generation circuit.

9. The clock generation apparatus according to claim 1, wherein the digital temperature compensation circuit includes a linear correction circuit which linearly corrects the digital temperature signal.

10. The clock generation apparatus according to claim 1, wherein
    the first voltage-controlled oscillator generates the output clock signal by using a crystal resonator, a MEMS resonator, or a langasite type resonator, and
    the second voltage-controlled oscillator generates the internal clock signal by using a PLL.

11. The clock generation apparatus according to claim 10, wherein the crystal resonator, the MEMS resonator, or the langasite type resonator is provided outside a semiconductor chip containing the AD converter and the digital temperature compensation circuit.

12. The clock generation apparatus according to claim 10, further comprising an oven control circuit which controls temperature of the crystal resonator, the MEMS resonator, or the langasite type resonator to be kept constant.

13. A clock generation method for generating an output clock signal, comprising:
    a first voltage-controlled oscillator outputs the output clock signal;

an AD converter outputs, with a second voltage-controlled oscillator, an internal clock signal phase-locked to the output clock signal in response to a digital temperature signal having become a value corresponding to an analog temperature signal from a temperature sensor, detects a phase difference between the output clock signal and the internal clock signal, and generates the digital temperature signal according to the phase difference which has been detected, to output it to the second voltage-controlled oscillator; and a digital temperature compensation circuit compensates a frequency of the output clock signal of the first voltage-controlled oscillator by using the digital temperature signal;

wherein the digital temperature compensation circuit compensates the frequency of the output clock signal by using a compensation function associated with each of a plurality of temperature zones into which a predetermined temperature range is divided, and the digital temperature compensation circuit controls the frequency of the output clock signal of the first voltage-controlled oscillator by using a temperature compensation value stored in a lookup table, in response to the digital temperature signal indicating temperature of a boundary portion between the temperature zones.

14. The clock generation method according to claim 13, wherein the second voltage-controlled oscillator outputs the internal clock signal with a frequency according to the analog temperature signal and the phase difference which has been detected.

15. The clock generation method according to claim 14, wherein the second voltage-controlled oscillator includes a ring oscillator which oscillates at a frequency according to a difference between temperature designated by the analog temperature signal and temperature designated by the digital temperature signal.

16. A clock generation apparatus which generates an output clock signal, comprising:

a first voltage-controlled oscillator which outputs the output clock signal;

an AD converter which includes: a second voltage-controlled oscillator which outputs an internal clock signal phase-locked to the output clock signal in response to a digital temperature signal having become a value corresponding to an analog temperature signal from a temperature sensor; a phase comparator which detects a phase difference between the output clock signal and the internal clock signal; and a digital temperature signal generator which generates the digital temperature signal according to the phase difference detected by the phase comparator, to output it to the second voltage-controlled oscillator; and a digital temperature compensation circuit which compensates a frequency of the output clock signal of the first voltage-controlled oscillator by using the digital temperature signal, wherein the digital temperature compensation circuit includes a function generation circuit that generates an N-th order compensation function from the digital temperature signal using an adjustment parameter stored in a storage unit, and the digital temperature compensation circuit controls the frequency of the output clock signal of the first voltage-controlled oscillator by using the generated compensation function.

17. The clock generation apparatus according to claim 16, wherein the second voltage-controlled oscillator outputs the internal clock signal with a frequency according to the analog temperature signal and the phase difference detected by the phase comparator.

18. The clock generation apparatus according to claim 16, wherein the second voltage-controlled oscillator includes a ring oscillator which oscillates at a frequency according to a difference between temperature designated by the analog temperature signal and temperature designated by the digital temperature signal.

19. The clock generation apparatus according to claim 16, wherein the AD converter includes:

a determination circuit which determines whether the phase difference detected by the phase comparator has come out of a predetermined range;

a frequency detection circuit which detects frequencies of the output clock signal and the internal clock signal in response to the phase difference detected by the phase comparator having come out of the predetermined range; and a selection circuit which selects the phase difference detected by the phase comparator in response to the phase difference detected by the phase comparator falling within the predetermined range, and selects a phase difference decided according to a result of comparing a frequency equivalent to an integer multiple of the frequency of the output clock signal with the frequency of the internal clock signal in response to the phase difference detected by the phase comparator having come out of the predetermined range, and the second voltage-controlled oscillator outputs the internal clock signal with a frequency according to the analog temperature signal and the phase difference selected by the selection circuit.

20. The clock generation apparatus according to claim 16, wherein the AD converter includes a first delta-sigma modulator which modulates a signal which is based on a phase difference signal according to the phase difference between the output clock signal and the internal clock signal, to output it to the second voltage-controlled oscillator.

\* \* \* \* \*